(12) United States Patent
Arias et al.

(10) Patent No.: US 7,969,335 B2
(45) Date of Patent: *Jun. 28, 2011

(54) DIGITAL CORRECTION OF NONLINEARITY ERRORS OF MULTIBIT DELTA-SIGMA DIGITAL TO ANALOG CONVERTERS

(75) Inventors: Jesus Arias, Valladolid (ES); Peter Kiss, Basking Ridge, NJ (US); Johannes G. Ransijn, Wyomissing Hills, PA (US); James D. Yoder, Leola, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/041,204

(22) Filed: Mar. 3, 2008

(65) Prior Publication Data

US 2008/0150773 A1      Jun. 26, 2008

Related U.S. Application Data

(63) Continuation of application No. 11/430,285, filed on May 8, 2006, now Pat. No. 7,362,247.

(60) Provisional application No. 60/678,910, filed on May 6, 2005.

(51) Int. Cl.
*H03M 1/10*      (2006.01)
(52) U.S. Cl. ......... 341/120; 341/118; 341/143; 341/144
(58) Field of Classification Search .................. 341/118, 341/120, 143, 144, 153
See application file for complete search history.

(56) References Cited

U.S. PATENT DOCUMENTS

| | | | | | |
|---|---|---|---|---|---|
| 4,939,516 | A | * | 7/1990 | Early | 341/143 |
| 5,936,561 | A | * | 8/1999 | Lee | 341/143 |
| 6,271,781 | B1 | * | 8/2001 | Pellon | 341/143 |
| 6,313,775 | B1 | * | 11/2001 | Lindfors et al. | 341/143 |
| 6,359,575 | B1 | * | 3/2002 | Knudsen | 341/118 |
| 6,380,874 | B1 | * | 4/2002 | Knudsen | 341/118 |
| 6,611,221 | B1 | * | 8/2003 | Soundarapandian et al. | 341/143 |
| 6,970,120 | B1 | * | 11/2005 | Bjornsen | 341/120 |

OTHER PUBLICATIONS

X. Wang, P. Kiss, U. Moon, J. Steensgaard and G.C. Temes, "Digital estimation and correction of DAC errors in multibit A~ADCs," Electronics Letters, pp. 414-415, No. 37, No. 7 (Mar. 29, 2001).*

* cited by examiner

*Primary Examiner* — Linh V Nguyen
(74) *Attorney, Agent, or Firm* — John C. Pokotylo; Straub & Pokotylo

(57) ABSTRACT

Digital correction of multibit ADAC nonlinearities for error feedback DACs is provided. The integral nonlinearity (INL) error of the multibit ADAC is estimated (on line or off line) by a low-resolution calibration ADC (CADC) and stored in a random-access memory (RAM) table. The INL values are then used to compensate for the ADAC's distortion in the digital domain. When this compensation is combined with mismatch-shaping techniques such as DWA, the resolution requirement for CADC can be relaxed significantly. The implementation of the proposed correction circuit for error-feedback modulators is inherently simple, since the correction only needs a digital summation without any additional digital filtering.

7 Claims, 36 Drawing Sheets

DIGITAL CORRECTION OF NONLINEARITY ERRORS OF MULTIBIT DELTA-SIGMA DIGITAL TO ANALOG CONVERTERS

§0. RELATED APPLICATIONS

This application is a continuation of U.S. patent application Ser. No. 11/430,285 (referred to as "the '285 application" and incorporated herein by reference), titled "DIGITAL CORRECTION OF NONLINEARITY ERRORS OF MULTIBIT DELTA-SIGMA DIGITAL TO ANALOG CONVERTERS," filed on May 8, 2006 now U.S. Pat. No. 7,362,247 and listing Jesus ARIAS; Peter KISS; Johannes G. RANSIJN and James D. YODER as inventors, which claimed the benefit, under 35 U.S.C. §119(e)(1), to the filing date of provisional patent application Ser. No. 60/678,910 (referred to as "the '910 application, and incorporated herein by reference), titled "NONLINEARITY CORRECTION FOR MULTIBIT ΔΣ DACS", filed on May 6, 2005, and listing Jesus ARIAS and Peter KISS as inventors, for any inventions disclosed in the manner provided by 35 U.S.C. §112, ¶ 1. The present invention is not limited to any requirements of any of the exemplary embodiments described in the provisional application.

§1. BACKGROUND OF THE INVENTION

§1.1 Field of the Invention

The present invention concerns correcting integral nonlinearity errors (INL) and/or differential nonlinearity errors (DNL) of multi-bit digital-to-analog converters (DAC). In particular, the present invention concerns employing both a calibration analog-to-digital converter (CADC) to estimate DACs nonlinearity errors, as well as first-order mismatch shaping, such as data-weighted averaging (DWA) for example, in order to further simplify circuit design while increasing the DAC's accuracy.

§1.2 Related Art

The use of multi-bit quantizers in delta-sigma modulators has great advantages over single-bit ones, such as increased signal-to-noise ratio (SNR) and improved stability. (See, e.g., S. R. Norsworthy, R. Schreier, and G. C. Temes, Eds., *Delta-Sigma Data Converters: Theory, Design, and Simulation*, New York: IEEE Press, 1996), referred to as "the Norsworthy paper").) However, the performance bottleneck is usually the linearity of the internal multi-bit "analog" DAC (ADAC1), which needs to be at least as good as that of the overall converter. This limitation applies for both multi-bit delta-sigma analog-to-digital converters (See FIG. 4.) and digital-to-analog converters (See FIG. 5.). (See, e.g., the Norsworthy paper.)

There are many known techniques to deal with the nonlinearity of the multi-bit ADAC in delta-sigma modulators. Dynamic element matching, also called mismatch shaping (See, e.g., the Norsworthy paper; L. R. Carley, "A noise-shaping coder topology for 15+ bit converters," *IEEE Journal of Solid-State Circuits*, vol. SC-24, no. 4, pp. 267-263, April 1989; B. H. Leung and S. Sutarja, "Multi-bit sigma-delta A/D converter incorporating a novel class of dynamic element matching techniques," *IEEE Transactions on Circuits and Systems-II: Analog and Digital Signal Processing*, vol. 39, no. 1, pp. 35-51, January 1992 (referred to as "the Leung paper"); R. T. Baird and T. S. Fiez, "Linearity enhancement of multibit delta-sigma A/D and D/A converters using data weighted averaging," *IEEE Transactions on Circuits and Systems-II: Analog and Digital Signal Processing*, vol. 42, no. 12, pp. 753-761, December 1995 ("the Baird paper"); R. Schreier and B. Zhang, "Noise-shaped multi-bit D/A converter employing unit elements," *IEE Electronics Letters*, vol. 31, no. 20, pp. 1712-1713, 1995 ("the Schreier paper"); T. Kwan, R. Adams, and R. Libert, "A stereo multibit sigma-delta DAC with asynchronous master-clock interface," *IEEE Journal of Solid-State Circuits*, vol. 37, no. 12, pp. 1881-1887, December 1996 ("the Kwan paper"); and I. Galton, "Spectral shaping of circuit errors in digital-to-analog converters," *IEEE Transactions on Circuits and Systems-II: Analog and Digital Signal Processing*, vol. 44, no. 10, pp. 808-817, October 1997 ("the Galton paper").) transforms harmonic distortion into shaped pseudo-random noise, which is usually acceptable in the output. There are several methods that can achieve first-order shaping such as individual-level averaging (See the Leung and Baird papers), vector feedback (See the Schreier paper.), butterfly structures (See the Kwan paper.), selection trees (See the Galton paper), etc.

However, first-order methods require relatively high values (e.g., 16 or higher) of the over-sampling ratio (OSR) to be effective. Therefore, second-order mismatch shaping techniques were developed. (See the Schreier and Galton papers.)

However, second-order methods need increased circuit complexity, which increases power consumption and requires a large integrated chip area. In addition to dynamic element matching, off-line correction (See, e.g., M. Sarhang-Nejad and G. C. Temes, "A high-resolution multibit sigma-delta ADC with digital correction and relaxed amplifier requirements," *IEEE Journal of Solid-State Circuits*, vol. 28, no. 6, pp. 648-660, June 1993), and on-line correction (See, e.g., C. Petrie and M. Miller, "A background calibration technique for multibit delta-sigma modulators," in *Proceedings of the IEEE International Symposium on Circuits and Systems*, May 2000, vol. 2, pp. II.29-II.32; and X. Wang, P. Kiss, U. Moon, J. Steensgaard, and G. C. Temes, "Digital estimation and correction of DAC errors in multibit delta-sigma ADCs," *IEE Electronics Letters*, vol. 37, no. 7, pp. 414-415, 29 Mar. 2001).), digital calibration, as well as on-line analog correction (See, e.g., U. Moon, J. Silva, J. Steensgaard, and G. C. Temes, "A switched-capacitor DAC with analog mismatch correction," *IEE Electronics Letters*, vol. 35, no. 22, pp. 1903-1904, October 1999).), correction have been used. An on-line digital linearizing technique for ADACs embedded into pipelined ADCs, based on correlation operations, was also discussed. (See, e.g., I. Galton, "Digital cancellation of D/A converter noise in pipelined A/D converters," *IEEE Transactions on Circuits and Systems-II: Analog and Digital Signal Processing*, vol. 47, no. 3, pp. 185-196, March 2000).

It was shown recently that multi-bit error-feedback (EF) modulators can use aggressive noise-transfer functions (NTF) without compromising stability and can therefore, achieve high resolution even for low (e.g., 4 or 8) OSR values. (See, e.g., P. Kiss, J. Arias, and D. Li, "Stable high-order delta-sigma digital-to-analog converters," *IEEE Transactions on Circuits and Systems—I: Regular Papers*, vol. 51, no. 1, pp. 200-205, January 2004 (referred to as "the Kiss paper"), and See especially FIG. 6.) Unfortunately the EF topology is not suitable for delta-sigma ADCs since the imperfections of the analog loop filter H(z) would enter the critical input node and adversely affect the output. However, this drawback does not exist in digital modulator loops. Therefore, EF modulators are widely used in delta-sigma DACs. (See, e.g., U.S. Pat. No. 4,467,316 to H. G. Musmann and W. Korte, titled "Generalized interpolative method for digital/analog conversion of PCM signals"; and P. J. Naus, E. C. Dijkmans, E. F. Stikvoort, A. J. McKnight, D. J. Holland, and W. Bradinal, "A CMOS stereo 16-bit D/A converter for digital audio," *IEEE Journal of Solid-State Circuits*, vol. 22, no. 3, pp. 390-395, June 1987.), and fractional-N PLLs (See, e.g., S. Willingham, M. Perrott, B. Setterberg, A. Grzegorek, and B. McFarland, "An integrated 2.5 GHz delta-sigma frequency synthesizer with 5 µs settling and 2 Mb/s closed loop modulation," in *IEEE International Solid-State Circuits Conference, Digest of Technical Papers*, February 2000, pp. 200-201.).

A 4th-order 5-bit EF DAC was proposed in the Kiss paper which used an aggressive NTF. Since only 10-bit signal-to-noise-and-distortion ratio (SNDR) was targeted at an OSR of 4, using DWA was sufficient to handle the 5-bit ADAC's nonlinearity. The same 4th-order 5-bit EF DAC can potentially achieve 14 bits of resolution (88.9-dB SNR) for an OSR of 8. This accuracy, however, cannot be achieved with DWA (alone) at such a low OSR.

In view of the foregoing it would be useful to improve the correction of errors in digital filters including an analog digital-to-analog converter.

§2. SUMMARY OF THE INVENTION

Embodiments consistent with the present invention provide a digital correction of multibit ADAC nonlinearities for EF DACs which extends its performance well beyond 10 bits of resolution. In such embodiments, the integral nonlinearity (INL) error of the multibit ADAC is estimated (on line or off line) by a low-resolution calibration ADC (CADC) and stored in a random-access memory (RAM) table (See FIG. 7). The INL values are then used to compensate for the ADAC's distortion in the digital domain. When this compensation is combined with mismatch-shaping techniques such as DWA, the resolution requirement for CADC can be relaxed significantly. The implementation of the proposed correction circuit for error-feedback modulators is inherently simple, since the correction only needs a digital summation without any additional digital filtering.

§3. BRIEF DESCRIPTION OF THE DRAWINGS

§4. DETAILED DESCRIPTION

The present invention may involve novel methods, apparatus, message formats, and/or data structures for correcting integral nonlinearity errors (INL) of multi-bit digital-to-analog converters (DAC). The following description is presented to enable one skilled in the art to make and use the invention, and is provided in the context of particular applications and their requirements. Thus, the following description of embodiments consistent with the present invention provides illustration and description, but is not intended to be exhaustive or to limit the present invention to the precise form disclosed. Various modifications to the disclosed embodiments will be apparent to those skilled in the art, and the general principles set forth below may be applied to other embodiments and applications. For example, although a series of acts may be described with reference to a flow diagram, the order of acts may differ in other implementations when the performance of one act is not dependent on the completion of another act. Further, non-dependent acts may be performed in parallel. Also, as used herein, the article "a" is intended to include one or more items. Where only one item is intended, the term "one" or similar language is used. In the following, "information" may refer to the actual information, or a pointer to, identifier of, or location of such information. No element, act or instruction used in the description should be construed as critical or essential to the present invention unless explicitly described as such. Thus, the present invention is not intended to be limited to the embodiments shown and the inventors regard their invention to include any patentable subject matter described.

In the following, single-loop delta-sigma modulator topologies in which, or with which, the present invention may operate are described in §4.1. Then, proposed nonlinearity corrections for multi-bit delta-sigma DACs consistent with the present invention are described in §4.2. Thereafter, examples and simulations illustrating the usefulness of embodiments consistent with the present invention are provided in §4.3. Finally, some conclusions regarding the present invention are set forth in §4.4.

Figure 4:
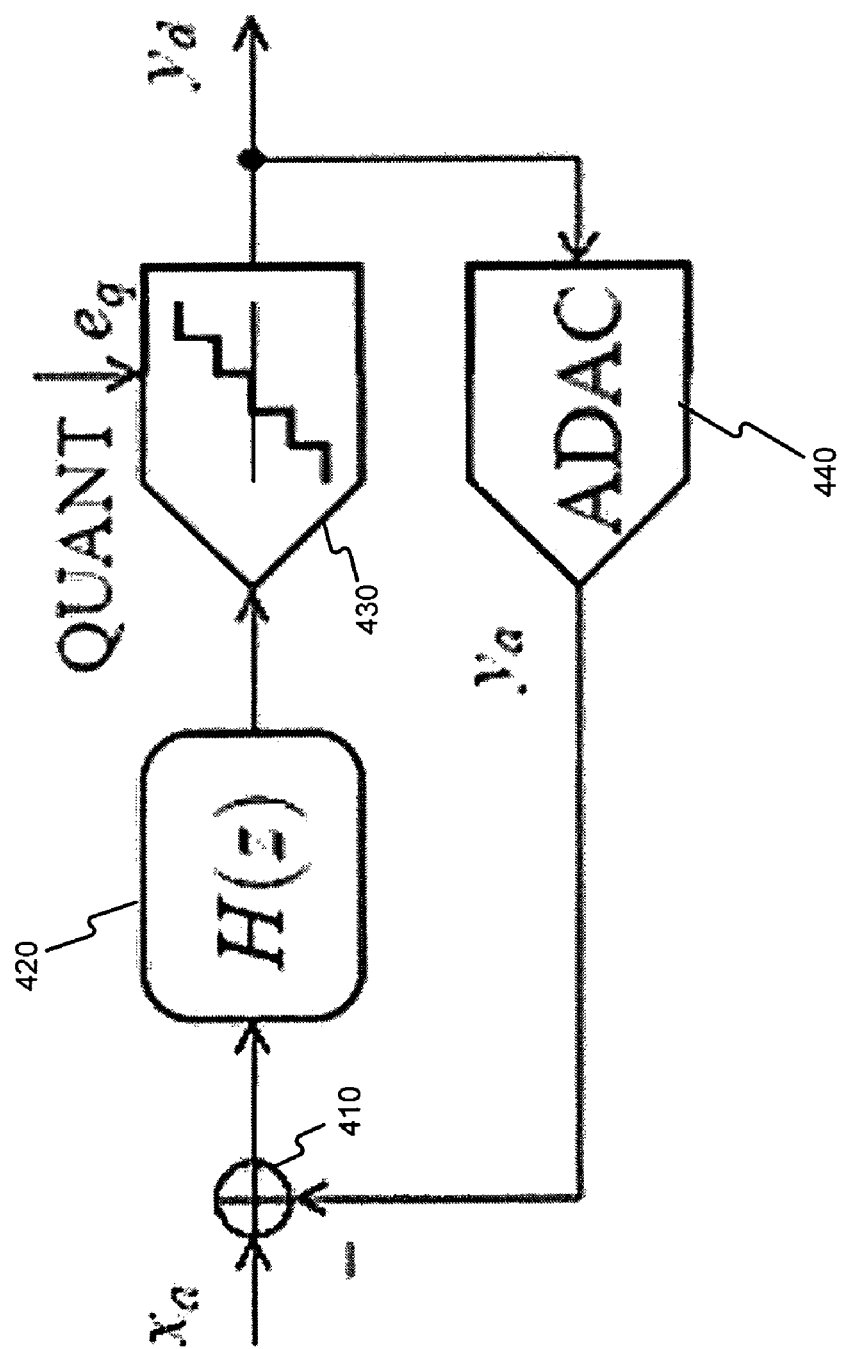
FIG. 4 is a single-loop delta-sigma modulator topology illustrating an ADC.
Figure 5:
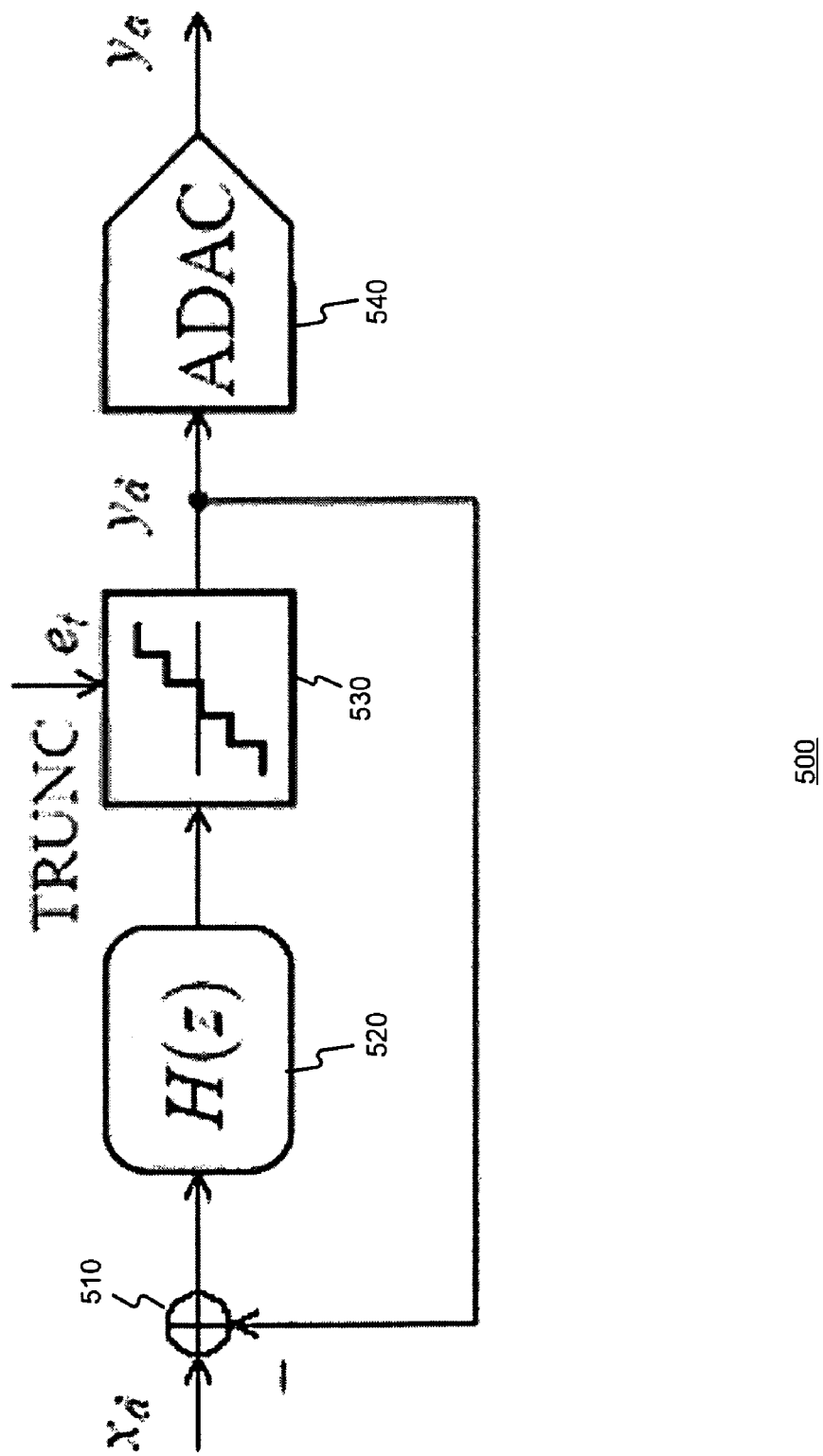
FIG. 5 is a single-loop delta-sigma modulator topology illustrating a DAC.
Figure 6:
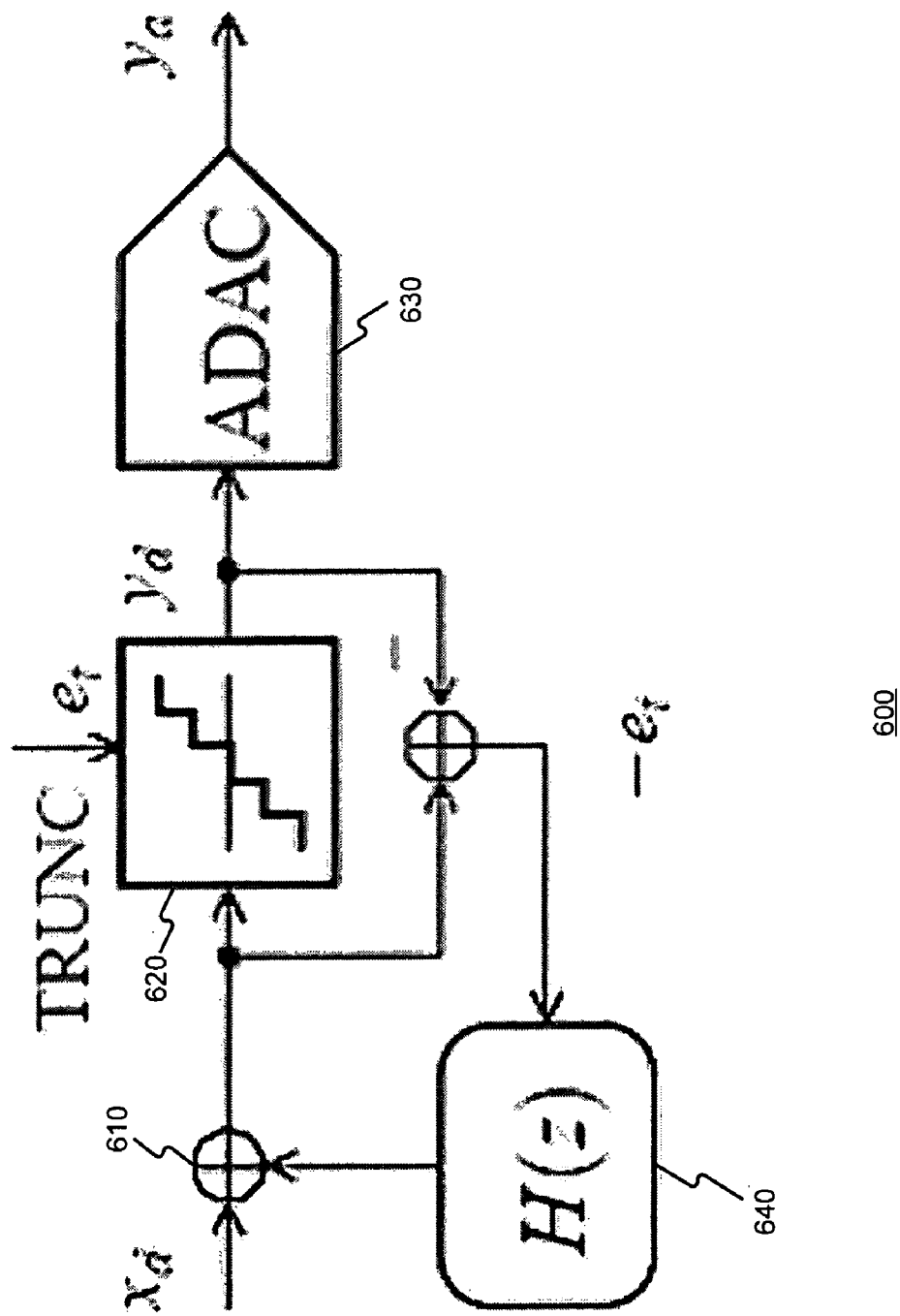
FIG. 6 is a single-loop delta-sigma modulator topology illustrating an error-feedback DAC.

§4.1 Exemplary Single-Loop Delta-Sigma Modulator Topologies in which, or with which, Embodiments Consistent with the Present Invention may Operate FIGS. 4-6 represent exemplary single-loop delta-sigma modulator topologies in which embodiments consistent with the present may be applied in order to improve their accuracy while reducing circuit complexity in comparison to that needed by prior methods to achieve such accuracy. In particular, FIG. 4 represents a delta-sigma analog to digital converter (ADC), FIG. 5 represents a delta-sigma digital-to-analog converter (DAC), and FIG. 6 represents an error-feedback DAC.

Figure 1:
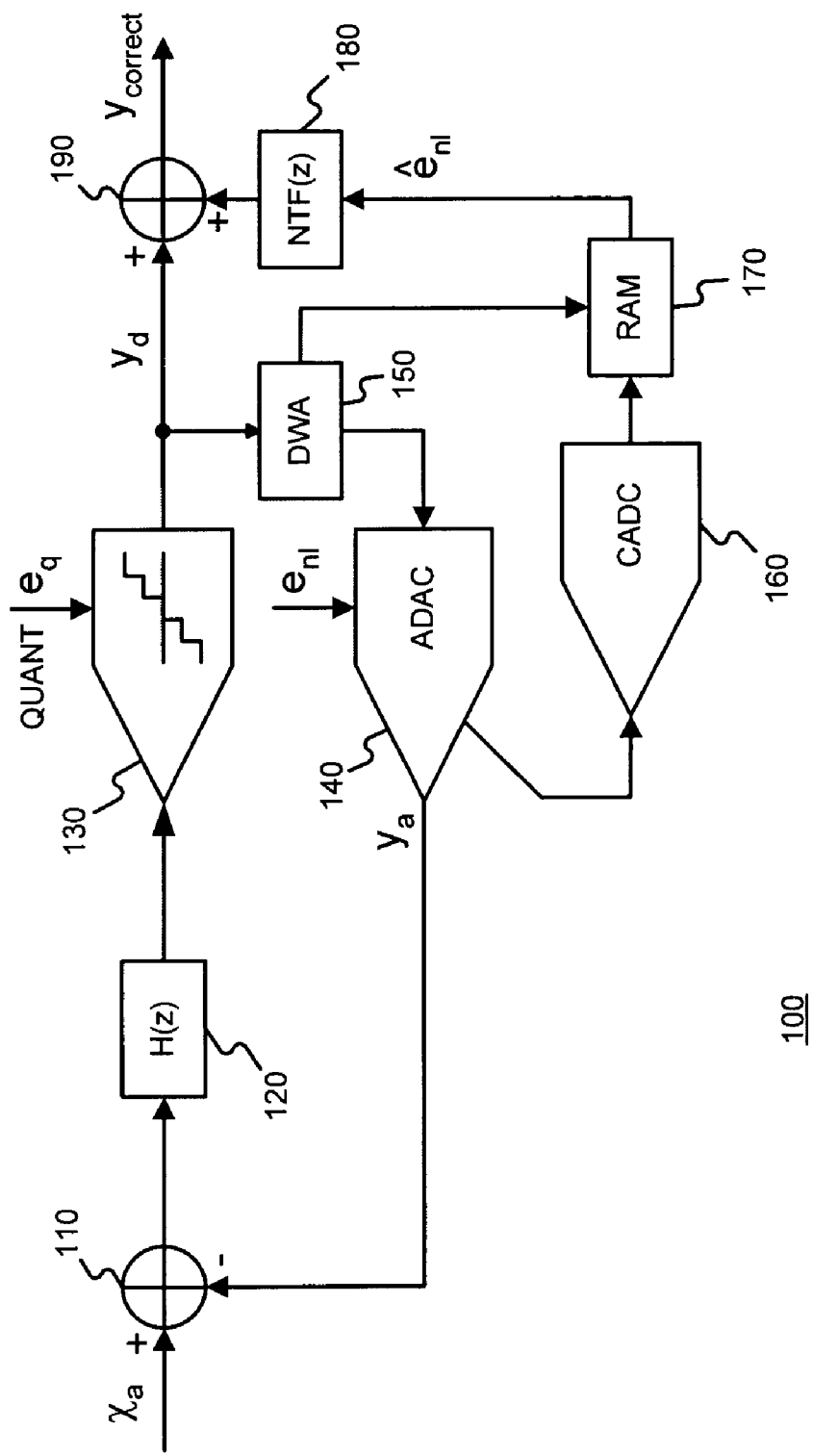
FIG. 1 is a delta-sigma analog-to-digital converter (ADC) wherein digital correction is performed by using calibration (e.g., CADC) and low-order mismatch-shaping (e.g., DWA) in a manner consistent with the present invention.
Figure 2:
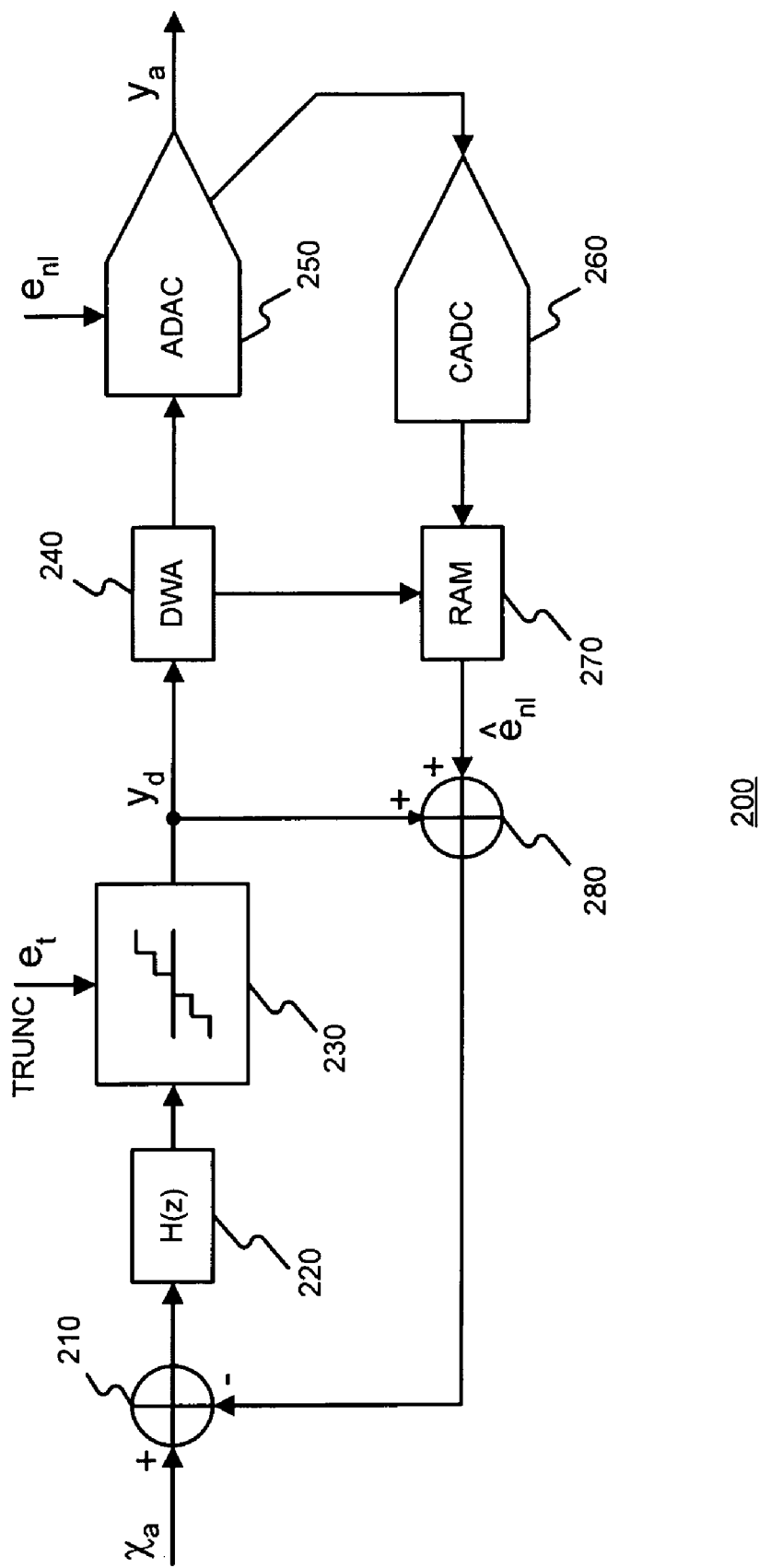
FIG. 2 is a delta-sigma digital-to-analog converter (DAC) wherein digital correction is performed by using calibration (e.g., CADC) and low-order mismatch-shaping (e.g., DWA) in a manner consistent with the present invention.
Figure 3:
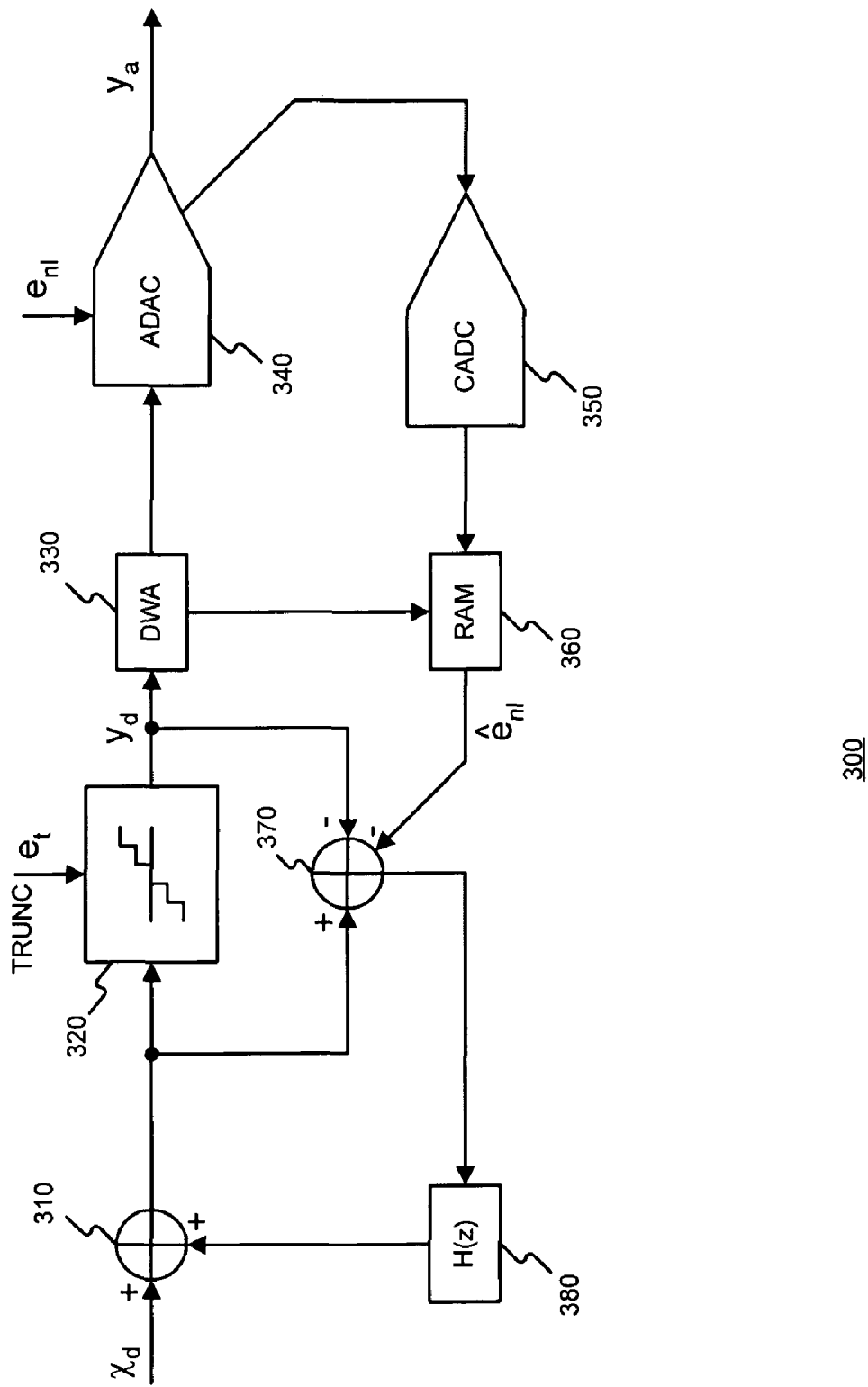
FIG. 3 is a delta-sigma error-feedback digital-to-analog converter (DAC) wherein digital correction is performed by using calibration (e.g., CADC) and low-order mismatch-shaping (e.g., DWA) in a manner consistent with the present invention.

FIGS. 1-3 correspond to FIGS. 4-6, respectively, where digital correction circuitry consistent with the present invention has been added. Such correction means include a calibration analog-to-digital converter (CADC) for estimating the nonlinearity errors, a RAM for storing such errors, and data-weighted averaging DWA which serves as a first-order-mismatch shaping method. As a result of such digital correction, the circuitry of FIGS. 1-3 offer a substantial improvement in accuracy as will be illustrated in simulation results described in §4.3 below. Further the circuit complexity for such accuracy is greatly reduced relative to that needed in prior techniques since low bit CADC and first-order-mismatching (e.g., DWA).

FIG. 1 is a delta-sigma analog-to-digital converter (ADC) 100 wherein digital correction is performed by using calibration (e.g., CADC 160) and low-order mismatch-shaping (e.g., DWA 150) in a manner consistent with the present invention. In particular, the delta-sigma ADC 100 includes adders 110 and 190, transfer function H(z) element(s) 120, quantizer 130, "analog" digital-to-analog converter (ADAC) 140, data-weight averaging element(s) 150, calibration analog-to-digital converter (CADC) 160, RAM 170, and noise transfer function element(s) 180.

An external analog signal $\chi_a$ and an analog signal $y_a$ outputted from the ADAC 140 are inputted to the adder 110 and are subtracted therein. The output of the adder 110 is provided as an input to the transfer function element 120. The output of the transfer function element 120 is then provided as an input to the quantizer 130. The quantizer's digital output signal $y_d$ is provided as an input to both the adder 190 and DWA 150. The output of the DWA 150 is provided as an input to the RAM 170, as well as the ADAC 140. The ADAC's output signal is the analog signal $y_a$ mentioned earlier, which is provided as an input to the adder 110. However, the ADAC's 140 output is also provided as an input to the CADC 160. The output of the CADC 160 is provided as an input to the RAM 170. Therefore, RAM 170 receives input signals from both the DWA 150 and CADC 160, and provides an output signal $\hat{e}_{n1}$ as an input to the noise transfer function element 180. The output of the noise transfer function 180 is provided as an input to the adder 190 wherein signals $\hat{e}_{n1}$ and $y_d$ are added to produce $y_{correct}$.

The transfer function element 120 accepts the output provided from the adder 110 and performs a filtering operation on it. The quantizer 130 is responsible for quantizing the output signal of the transfer function element 120 in order to digitize it. As seen in FIG. 1, the quantizer 130 contains quantization errors $e_q$. The DWA 150 performs an algorithm for reducing error effects and performs a first-order mismatch-shaping technique. The ADAC 140 is responsible for converting a digital signal to an analog signal and inherently contains non-linearity errors $e_{n1}$. The CADC 160 is a calibration analog-to-digital converter and is responsible for estimating the ADAC's non-linear errors $e_{n1}$. The RAM 170 is used for storing the ADAC's non-linear errors among other information. The NTF(z) element 180 is a digital filter which usually implements the noise transfer function of the delta-sigma modulator in order to enhance the accuracy of the error correction (e.g., error cancellation).

FIG. 2 is a delta-sigma digital-to-analog converter (DAC) 200 wherein digital correction is performed by using calibration (e.g., CADC) and low-order mismatch-shaping (e.g., DWA) in a manner consistent with the present invention. In particular, the DAC 200 may include adders 210 and 280, transfer function H(z) element (s) 220, truncator 230, data-weight averaging element 240, "analog" digital-to-analog converter (ADAC) 250, calibration analog-to-digital converter (CADC) 260, and RAM element 270.

An external analog signal $\chi_a$ and a signal outputted from the adder 280 are provided as inputs to the adder 210 and are subtracted therein. The output of the adder 210 is provided as an input to the transfer function element 220. The output of the transfer function element 220 is provided as an input to the truncator 230. The output of the truncator $y_d$ is provided as an input to both the adder 280 and DWA 240. Then, the DWA's 240 output signal provided as an input to the RAM 270, as well as the ADAC 250. The ADAC's 250 output signal is the analog signal $y_a$. However, the ADAC's 250 output signal is also provides as an input to the CADC 260. The output signal of the CADC is provided as an input to the RAM 270. Therefore, RAM 270 receives input signals from both the DWA 240 and CADC 260. The RAM 270 outputs a signal $\hat{e}_{n1}$ which is provided as an input to the adder 280. Hence adder 280 adds signals $y_d$ and $\hat{e}_{n1}$. As mentioned above, the output of the adder 280 is provided as an input to the adder 210.

The transfer function element 220 accepts the output signal of the adder 210 and performs a filtering operation on it. The truncator 230 is responsible for outputting only the most significant bits of an input signal. As seen in FIG. 2, the truncator 230 contains truncation errors $e_t$. The DWA 240 performs an algorithm for reducing error effects—it 240 performs a first-order mismatch-shaping technique. The ADAC 250 is responsible for converting a digital signal to an analog signal and inherently contains non-linearity errors $e_{n1}$. The CADC 260 is a calibration analog-to-digital converter and is responsible for estimating the ADAC's 250 non-linear errors $e_{n1}$. The RAM 170 may be used to store the ADAC's non-linear errors among other information.

FIG. 3 is a delta-sigma error-feedback digital-to-analog converter (DAC) 300 wherein digital correction is performed by using calibration (e.g., CADC) and low-order mismatch-shaping (e.g., DWA) in a manner consistent with the present invention. In particular, the DAC 300 might include adders 310 and 370, transfer function H(z) element 380, truncator 320, data-weighting averaging element 330, "analog" digitalto-analog converter (ADAC) 340, calibration analog-to-digital converter (CADC) 350, and RAM 360.

An external analog signal $\chi_a$ and a signal outputted from the transfer function H(z) element 380 are provided as inputs to the adder 310 where they are added. The output of the adder 310 is provided as an input to the truncator 320, as well as an input to the adder 370. The output of the truncator 320, output signal $y_d$, is provided as an input to both the adder 370 and DWA 330. The DWA's 330 output is provided as an input to both the RAM 360, as well as the ADAC 340. The ADAC's 340 output signal is the analog signal $y_a$. However, the ADAC's 340 output signal is also provided as an input to the CADC 350. The output of the CADC is provided as an input to the RAM 360. Therefore, RAM 360 receives input signals from both the DWA 330 and CADC 350. The RAM 360 outputs a signal $\hat{e}_{n1}$ which is provided as an input to the adder 370. Hence adder 370 subtracts signals $y_d$ and $\hat{e}_{n1}$ from the output of the adder 3 10. Next, the output of the adder 370 provided as an input to the transfer function H(z) 380.

The transfer function 380 is responsible for accepting the output signal of the adder 370 and performing a filtering operation on it. The truncator 320 is responsible for outputting only the most significant bits of an input signal. As seen in FIG. 3, the truncator 320 contains truncation errors $e_t$. The DWA 330 performs an algorithm for reducing error effects—it performs a first-order mismatch-shaping technique. The ADAC 340 is responsible for converting a digital signal to an analog signal and inherently contains non-linearity errors $e_{n1}$. The CADC 350 is a calibration analog-to-digital converter and is responsible for estimating the ADAC's non-linear errors $e_{n1}$. The RAM 360 is basically used for storing the ADAC's non-linear errors among other information.

§4.2 Proposed Nonlinearity Correction

§4.2.1 Ideal Error-Feedback DAC

The block diagram of an error-feedback DAC is shown in FIG. 6. The truncator (TRUNC) 620 provides the most-significant bits (MSB) for the following DAC, and feeds the least significant bits (LSB) to the digital loop filter H(z) 640. Using an additive white-noise model for the truncator 620, which replaces a deterministic nonlinearity with a stochastic linear system, it results $$Y_d(z) = X_d(z) + (1 - H(z))E_t(z) = STF(z)X_d(z) + NTF(z)E_t(z); \quad (1)$$

where $e_t$ is the truncation error (similar to the quantization error $e_q$ in FIG. 4), STF(z) is the signal transfer function and NTF(z)=1−H(z) is the truncation error (or truncation noise) transfer function.

The digital error-feedback (EF) modulator is followed by a multi-bit ADAC 630, which converts the digital output $y_d$ into a proportional analog waveform $y_a$ (i.e., $y_a = \kappa \cdot y_d$). For simplicity of calculations, the scaling factor $\kappa$ can be assumed to be unity for ADAC 630, so $y_a = y_d$. Since ADAC 630 is in the critical path, its performance should be at least as good as that of the overall converter.

§4.2.1 Proposed Error Correction

Figure 7:
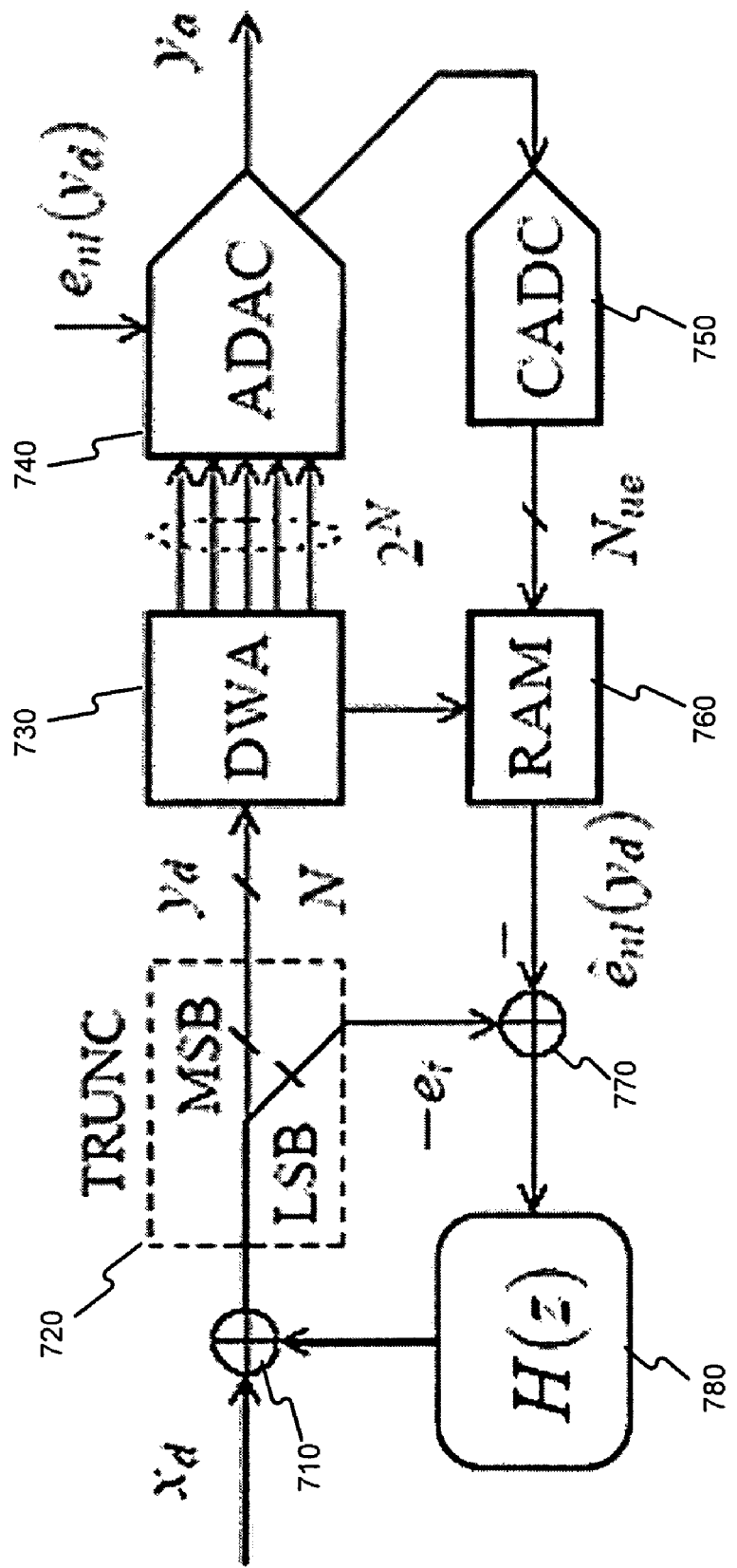
FIG. 7 is a delta-sigma error-feedback digital-to-analog converter (DAC) wherein digital correction is performed by using calibration (e.g., CADC) and low-order mismatch-shaping (e.g., DWA) in a manner consistent with the present invention.

In practical scenarios, ADAC is affected by nonlinearity errors. These errors can be modeled as an input-dependent additive term $e_{n1}(y_d)$, as shown in FIG. 7. When no correction is applied, the distorted output becomes $$Y_a(z) = X_d(z) + NTF(z)E_t(z) + E_{n1}(z) \quad (2)$$

The estimated values $\hat{e}_{n1}$ of the errors $e_{n1}$ are determined by CADC 750 and stored in the RAM table 760. One can decompose $\hat{e}_{n1}$ into $e_{n1} + \delta e_{n1}$, where $e_{n1}$ is the actual nonlinearity error of ADAC 740 and $\delta e_{n1}$ is the inaccuracy of the nonlinearity error's estimate due to CADC 750.

During normal operation, the $\hat{e}_{n1}(y_d)$ value, corresponding to the current digital output $y_d$, is read from the RAM table 760 and subtracted from the negated truncation error "$-e_t$" (FIG. 7). In other words, "$-e_t - \hat{e}_{n1}$" is fed back to the digital loop filter H(z) 780. From equation (2), therefore, the distorted output after correction becomes $$Y_a(z) = X_d(z) + NTF(z)\left(E_t(z) + \hat{E}_{n1}(z)\right) + E_{n1}(z) \quad (3)$$
$$= X_d(z) + NTF(z)E_t(z) + NTF(z)E_{n1}(z) - H(z)\delta E_{n1}(z).$$

The loop filter H(z) 780 has a magnitude of unity within the signal band, since H(z)+NTF(Z)=1 (from Equation (1)) and |NTF(z)|<<1 within the signal band. Therefore, the corrected output can be approximated as $$Y_a(z) \approx X_d(z) + NTF(z)E_t(z) + NTF(z)E_{n1}(z) - \delta E_{n1}(z) \quad (4)$$

where the first two terms describe the ideal output given in Equation (1), and the last two terms give the nonlinearity error's contribution after digital correction.

The difference between Equations (3) and (4) is that H(z)*dEnl(z) becomes dEnl(z). Since H(z)+NTF(z)=1 from Equation (1), and NTF(z) is very small (and therefore can be ignored), H(z) becomes 1. Since H(z) is 1, it disappears from Equation (4) to simplify further calculations and assessments.

As Equation (4) shows, the truncation error $e_t$ and the nonlinearity error $e_{n1}$ of the ADAC 740 are shaped in frequency by the same NTF When a high-order EF modulator is used, a high-order shaping of the truncation error and of the nonlinearity error is achieved. Therefore, this method is effective even at low OSRs.

Equation (4) also shows that the inaccuracies $\delta e_{n1}$ of the error estimation do not exhibit frequency shaping, and they directly degrade the precision of the corrected output. When the correction is combined with first-order mismatch-shaping techniques, $\delta e_{n1}$ gets also first-order shaped, and the resolution requirement for the CADC 750 can be relaxed significantly, as described in §4.2.2 below.

In summary, an exemplary correction consistent with the present invention "replaces" the nonlinearity error $e_{n1}$ (Equation (2)) with the nonlinearity error's estimate $\delta e_{n1}$ (Equation (4)). While strongly reducing $e_{n1}$ at low OSRs, using high-order mismatch-shaping techniques, $\delta e_{n1}$ can be made much smaller than $e_{n1}$ by employing the exemplary correction enhanced by first-order mismatch-shaping methods, such as DWA. The latter can be implemented with simple circuitry.

§4.2.2 Error Estimation Process

Estimating the actual nonlinearity of the ADAC can be done off-line (e.g., during manufacturing or prior to use) or on-line (e.g., during use). This estimation might involve measuring the relative error of each ADAC unit element via CADC, and computing the RAM table entries (which is merely the addition of the unit-element errors of all the selected elements). (See FIG. 7.) For on-line calibration, the ADAC should include a redundant element to replace the element under measurement.

Figure 8:
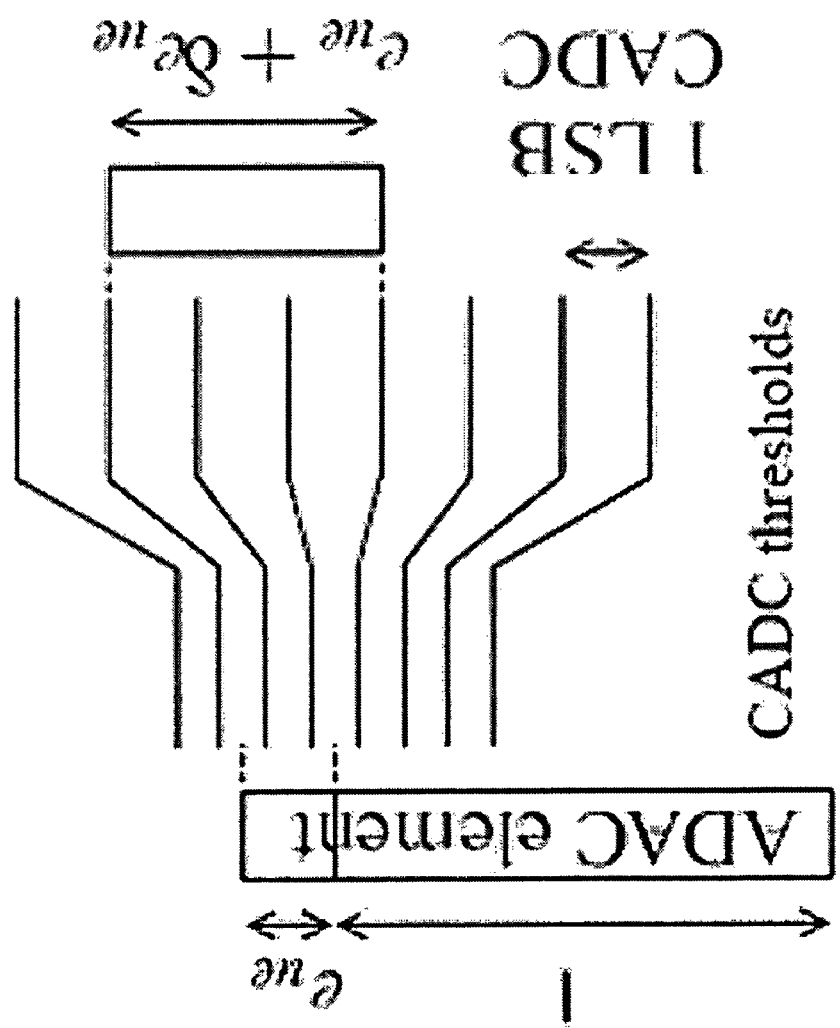
FIG. 8 illustrates an error estimation process by an CADC in a manner consistent with the present invention.

FIG. 8 shows an exemplary error estimation process consistent with the present invention. For an N-bit ADAC, there are $2^N$ unit elements (FIG. 7). Each unit element has a normalized value of 1 and it is affected by an error $e_{ue}$ due to circuit-element mismatch. This error is measured by comparing the ADAC element with a reference element and by amplifying the resulting error before the CADC conversion. The error $e_{ue}$ is affected by an inaccuracy $\delta e_{ue}$ mainly due to the finite resolution of CADC.

At each clock cycle n, $y_d[n]$ determines how many unit elements of ADAC are selected to generate an analog value for $y_a[n]$. The error scrambler (e.g., a DWA) chooses which elements are selected (specified by a set of elements $S[n]$) according to the mismatch shaping algorithm. The nonlinearity error $e_{n1}$ of ADAC at each clock cycle n is given by the sum of the errors of the selected unit elements:

$$e_{nl}(y_d[n]) = \sum_{i \in S[n]} e_{ue}(i) \qquad (5)$$

Since the error estimates $\hat{e}_{n1}$ and $\hat{e}_{ue}$ can be decomposed into $e_{n1}+\delta e_{n1}$ and $e_{ue}+\delta e_{ue}$, respectively, Equation (5) holds for inaccuracies too:

$$\delta e_{nl}(y_d[n]) = \sum_{i \in S[n]} \delta e_{ue}(i) \qquad (6)$$

Initially, these error terms might be assumed to be a white spectral density and a normal distribution for. Therefore, $\sigma_{n1}$ and $\sigma_{ue}$ might be used to represent the standard deviation of the random variables $\delta e_{n1}$ and $\delta e_{ue}$, respectively.

Since $\delta e_{ue}$ is mainly due to the quantization error of CADC, it is convenient to express $\sigma_{ue}$ as a function of the number of bits $N_{ue}$ of CADC. For a quantizer of $N_{ue}$ bits with its quantization error uniformly distributed over $$-\frac{1}{2} \ldots \frac{1}{2} LSB,$$

the standard deviation of the quantization error is given by:

$$\sigma_{ue} = \frac{1 LSB}{\sqrt{12}} = \frac{1}{\sqrt{12}} \frac{1}{2^{N_{ue}-1}} \qquad (7)$$

where the full scale of CADC is normalized to 1. Therefore:

$$N_{ue} \cong \frac{\log_2 0.3}{\sigma_{ue}} \text{ [bits]} \qquad (8)$$

Similarly, $\sigma_{n1}$ can also be expressed by a corresponding $N_{n1}$-bit quantizer of:

$$N_{nl} \cong \frac{\log_2 0.3}{\sigma_{nl}} \text{ [bits]} \qquad (9)$$

Note that the values of the selected unit elements are summed together to generate an analog value for $y_a$, so the estimation errors $\delta e_{ue}$ of the unit elements get "averaged" in this process and the relative accuracy of the overall ADAC is better than that of a single element. Based on the derivation of described in Sec. 8.3.1 of the Norsworthy paper, it results:

$$\sigma_{nl} = \frac{1}{2\sqrt{2^N}} \sigma_{ue} \qquad (10)$$

Therefore, only a fraction of the error $\delta e_{ue}$ of CADC affects the actual output $y_a$. In other words, $\sigma_{ue}$ can be $$2^{\frac{N}{2}+1}$$

times larger than $\sigma_{n1}$. In other words, $N_{ue}$ can be $$\frac{N}{2}+1$$

bits less than $N_{n1}$.

In the following section, an approximation of the required accuracy for CADC is derived.

§4.2.3 Required Accuracy for Error Estimation

The overall SNDR of the corrected converter is limited by many noise and distortion elements, such as the shaped truncation error $e_t$, the shaped nonlinearity error $e_{n1}$, and the non-shaped nonlinearity error's estimate $\delta e_{n1}$, as shown in Equation (4). Usually, the dominant contributors are the shaped truncation error $e_t$ and the non-shaped nonlinearity error's estimate $\delta e_{n1}$. It is generally acceptable that the overall SNDR of the corrected converter to drop by about 1 dB from its ideal (i.e., truncation-error limited) value due to imperfect nonlinearity error correction. Therefore, as a rule of thumb, the resolution of CADC should be chosen such that the in-band power of $\delta e_{n1}$ should be 6 dB lower than the in-band power of the shaped $e_t$. The noise budget resulting from Equation (4) might be distributed differently when needed.

Next, an approximation of the required accuracy for CADC is derived. Again, this approximation assumes white power spectral density and normal distribution for the error terms. First, the achievable SNR of the corrected output $y_a$, when limited by $\delta e_{n1}$ only, is given by:

$$SNR_0 = 1.76 + 6.02(N_{n1}+N) + 10 \log_{10}(OSR) \text{ [dB]} \qquad (11)$$

where N is the number of bits of $y_a$. When first-order mismatch shaping is used, Equation (11) becomes:

$$SNR_1 = 1.76 + 6.02(N_{n1}+N) + 30 \log_{10}(OSR) - 5.17 \text{ [dB]}: \qquad (12)$$

Since $N_{ue}$ can be $$\frac{N}{2}+1$$

bits less than $N_{n1}$, Equations (10)-(12), thus, become:

$$SNR_0 = 1.76 + 6.02(N_{ue}+1.5N+1) + 10 \log_{10}(OSR) \text{ [dB]} \qquad (13)$$

$$SNR_1 = 1.76 + 6.02(N_{ue}+1.5N+1) + 30 \log_{10}(OSR) - 5.17 \text{ [dB]} \qquad (14)$$

Equations (13)-(14) express the impact on the achievable SNR by the number of bits $N_{ue}$ of CADC. This effect of the error-estimation accuracy on the corrected DAC's performance is represented graphically on FIG. 9 for an OSR of 4 and 8, N of 5 bits, and for various resolutions of CADC.

The difference between Equation (14) (without DWA but with calibration) and Equation (13) (with DWA and with calibration) is 20*log10 (OSR)−5.14. This formula is independent of "Nue" and "N", which is advantageous. Quantitatively, 20*log10 (OSR)−5.14 gives about 13 dB and 7 dB improvement for using DWA (along with calibration) for OSR of 8 and 4, respectively. These numbers are consistent with FIG. 4.

As stated earlier, $SNR_0$ (or $SNR_1$) should exceed the truncation-error limited SNR obtainable with an ideal ADAC by at least 6 dB. When this occurs, the overall corrected SNDR of a practical converter drops by about 1 dB from its ideal value. Consequently, FIG. 9 can serve as a guidance to choose the resolution for CADC.

For example, an EF DAC with N of 5 bits and OSR of 8 targets an overall 14 bits or 86.04 dB of SNR. Therefore, a $SNR_0$ (or $SNR_1$) in excess of 92.04 dB is recommended. This yields to a 5-bit CADC without DWA (from FIG. 9 and Equation (13)) or a 3-bit CADC with DWA (from FIG. 9 and Equation (14)). This last result illustrates that implementing a 3-bit CADC and a DWA algorithm require simple circuitry.

§4.2.4 Exemplary Methods

Figure 10:
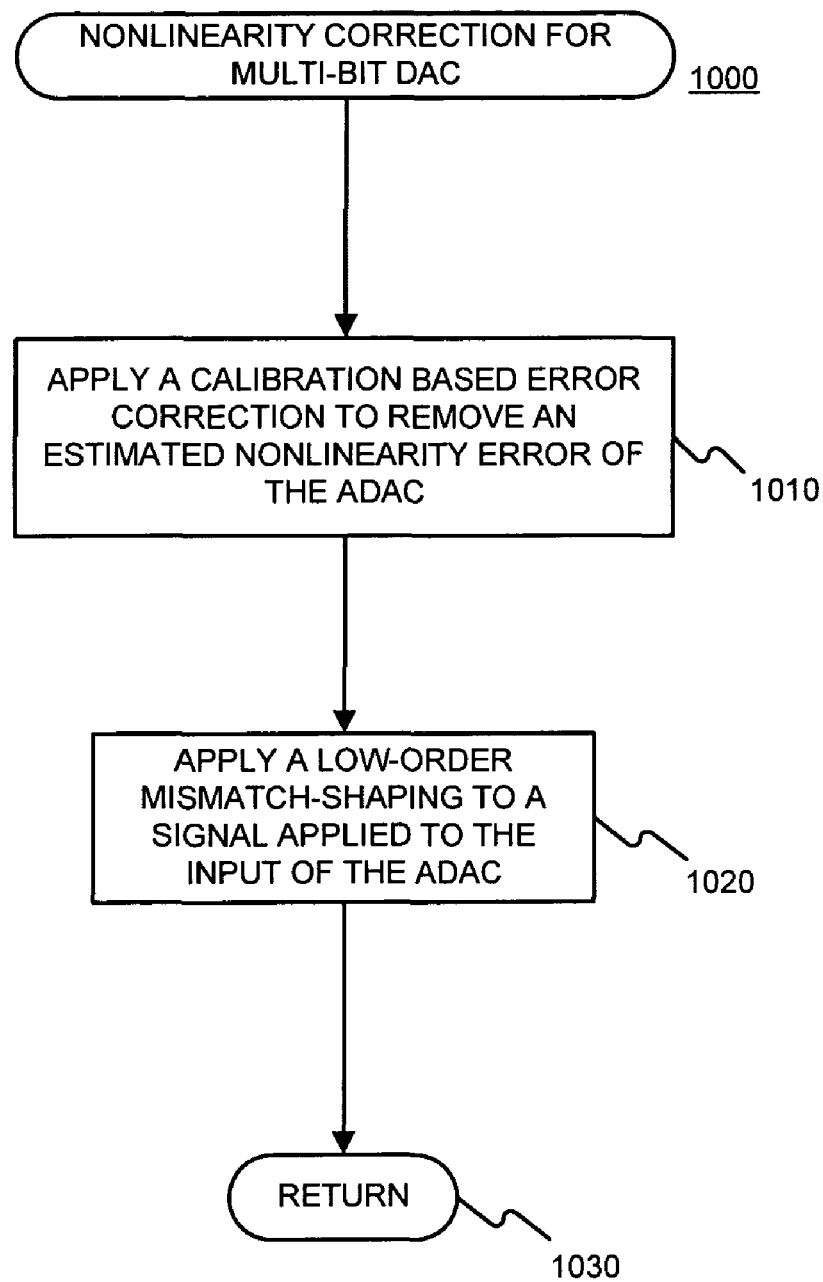
FIG. 10 is a flow diagram of an exemplary method for performing nonlinearity correction for multi-bit delta sigma digital-to-analog converters (DAC) in a manner consistent with the present invention.

FIG. 10 is a flow diagram of an exemplary method 1000 for performing nonlinearity correction for multi-bit delta sigma digital-to-analog converters (DAC) in a manner consistent with the present invention. In particular, the method 1000 may apply a calibration-based error correction to remove an estimated nonlinearity error of the ADAC. (Block 1010) Subsequently, the method 1000 may apply a low-order mismatch-shaping to a signal applied to the input of the ADAC. (Block 1020)

Referring back to blocks 1010 and 1020, the method 1000 may apply a calibration-based error correction by employing a CADC. The CADC may be used in order to estimate the ADAC's nonlinearity errors. These errors may be subsequently stored in a RAM table and are used to compensate for the ADAC's distortion (errors). Further, the method 1000 may apply a low-order mismatch-shaping (i.e., first-order mismatch-shaping) to a signal applied to the input of the ADAC which will further enhance the accuracy of the ADAC as well as reduce the circuit complexity that would otherwise be required for such high accuracy.

§4.2.5 Exemplary Apparatus

Embodiments consistent with the present invention might be implemented using hardware including integrated circuits (IC's), such as application specific IC's (ASICs). Examples of applications consistent with the present invention were described above with reference to FIGS. 1-3.

Figure 11:
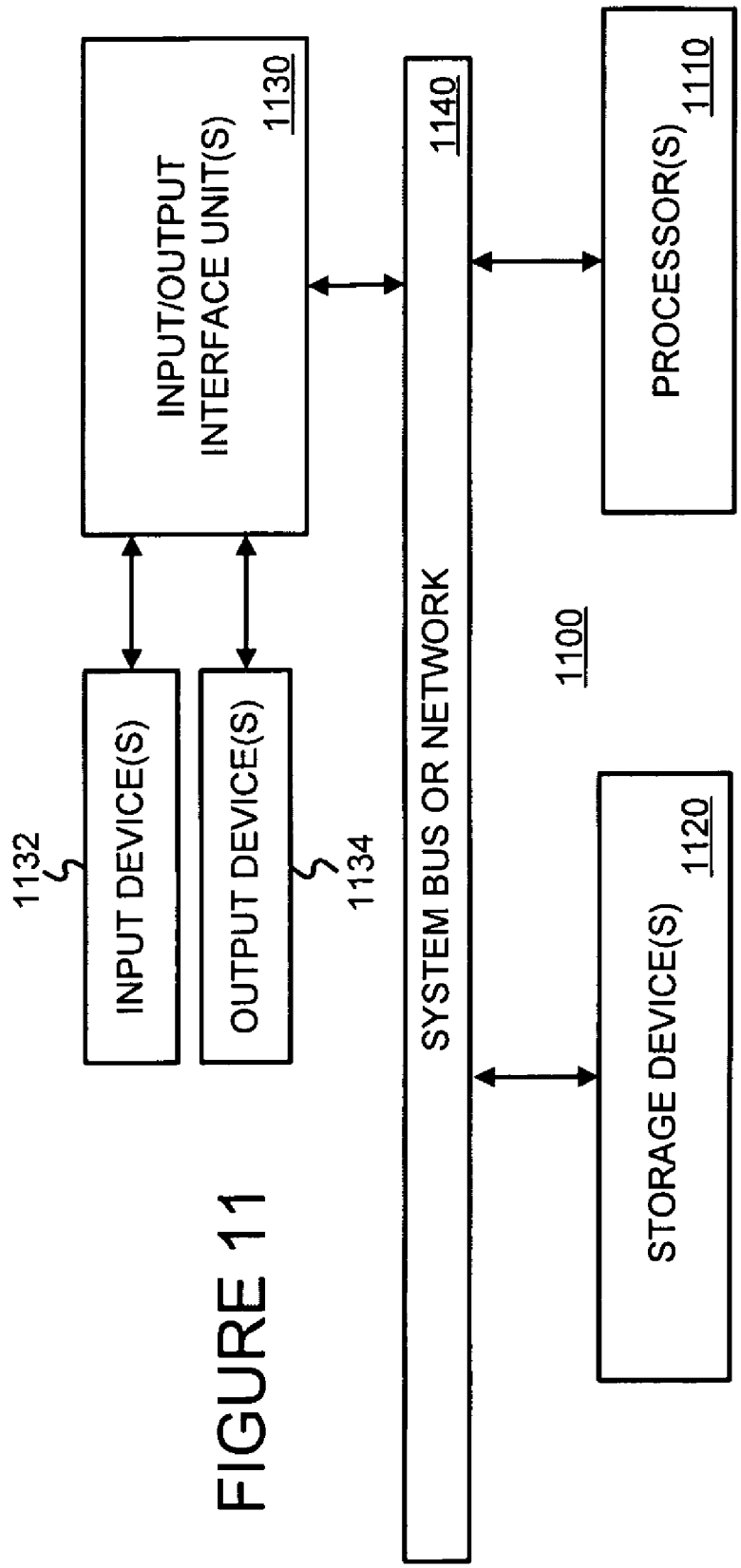
FIG. 11 is a block diagram of an exemplary apparatus that may perform various operations in a manner consistent with the present invention.

FIG. 11 is high-level block diagram of an alternative machine 1100 that may perform one or more of the operations discussed above. The machine 1100 basically includes one or more processors 1110, one or more input/output interface units 1130, one or more storage devices 1120, and one or more system buses and/or networks 1140 for facilitating the communication of information among the coupled elements. One or more input devices 1132 and one or more output devices 1134 may be coupled with the one or more input/output interfaces 1130.

The one or more processors 1110 may execute machine-executable instructions (e.g., C or C++ running on the Solaris operating system available from Sun Microsystems Inc. of Palo Alto, Calif. or the Linux operating system widely available from a number of vendors such as Red Hat, Inc. of Durham, N.C.) to effect one or more aspects of the present invention. At least a portion of the machine executable instructions may be stored (temporarily or more permanently) on the one or more storage devices 1120 and/or may be received from an external source via one or more input interface units 1130.

In one embodiment, the machine 1100 may be one or more conventional personal computers. In this case, the processing units 1110 may be one or more microprocessors. The bus 1140 may include a system bus. The storage devices 1120 may include system memory, such as read only memory (ROM) and/or random access memory (RAM). The storage devices 1120 may also include a hard disk drive for reading from and writing to a hard disk, a magnetic disk drive for reading from or writing to a (e.g., removable) magnetic disk, and an optical disk drive for reading from or writing to a removable (magneto-) optical disk such as a compact disk or other (magneto-) optical media.

A user may enter commands and information into the personal computer through input devices 1132, such as a keyboard and pointing device (e.g., a mouse) for example. Other input devices such as a microphone, a joystick, a game pad, a satellite dish, a scanner, or the like, may also (or alternatively) be included. These and other input devices are often connected to the processing unit(s) 1110 through an appropriate interface 1130 coupled to the system bus 1140. The output devices 1134 may include a monitor or other type of display device, which may also be connected to the system bus 1140 via an appropriate interface. In addition to (or instead of) the monitor, the personal computer may include other (peripheral) output devices (not shown), such as speakers and printers for example.

§4.2.4 Alternatives and Extensions

Referring back to FIGS. 1-3, there might be two (2) distinct operations with the RAM. The input from CADC loads the RAM with the ADAC nonlinearity error estimates. The output of the RAM is the readout of the nonlinearity error estimate which is then used for the correction. The nonlinearity error estimate is read according to the state of the DWA, thus the nonlinearity errors will be shaped accordingly. (This is why there is an arrow pointing from DWA to RAM.)

Although the noise transfer function enhances performance, some embodiments consistent with the present invention might not use a noise transfer function element, or might apply some other digital filter element instead.

Note that DWA is just one kind of first-order DEM (dynamic element matching or mismatch shaping or unit-element scrambling), so embodiments consistent with the present invention may use first-order DEMs other than DWAs. Indeed, embodiments consistent with the present invention may use various means for "mismatch shaping". Dynamic element matching, mismatch shaping and unit-element scrambling can be used interchangeably.

Note that the DWA-CADC combination can be applied to OF ADC and OF DAC as well, in addition to the EF DAC. DWA controls the usage of elements in the ADAC and the DWA controls the read out from the RAM.

§4.3 Example of Operations and Simulations

Figure 12A:
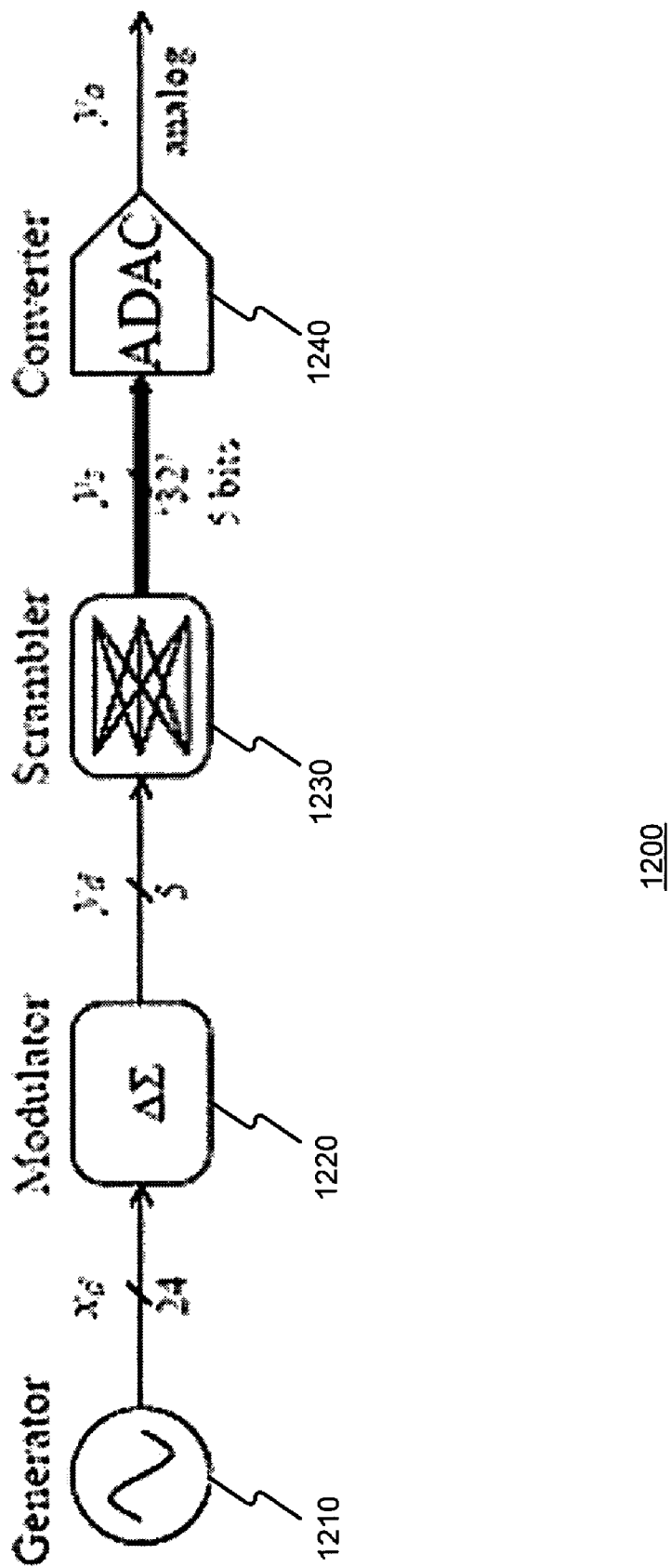
FIGS. 12A-12E illustrates discrete-components of two $4^{th}$ order 5-bit error-feedback DACs in a manner consistent with the present invention.
Figure 12B:
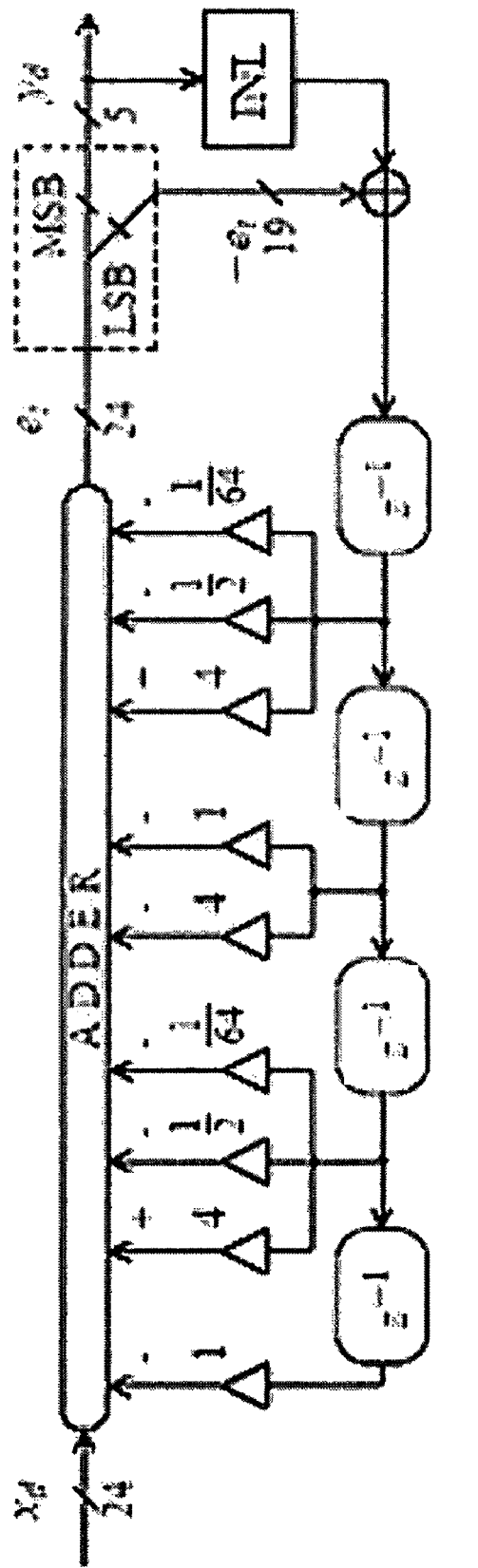
Figure 12C:
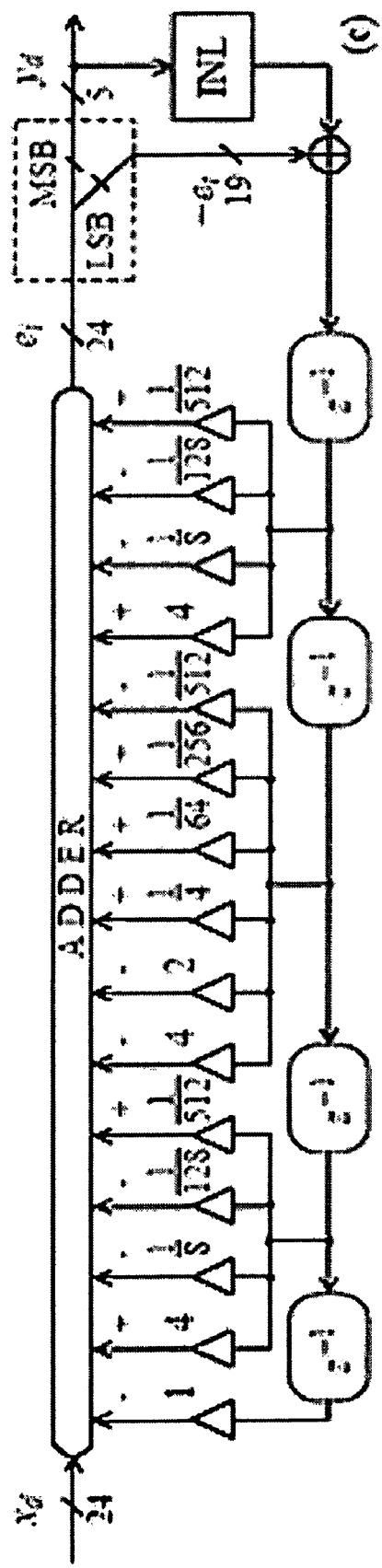
Figure 12D:
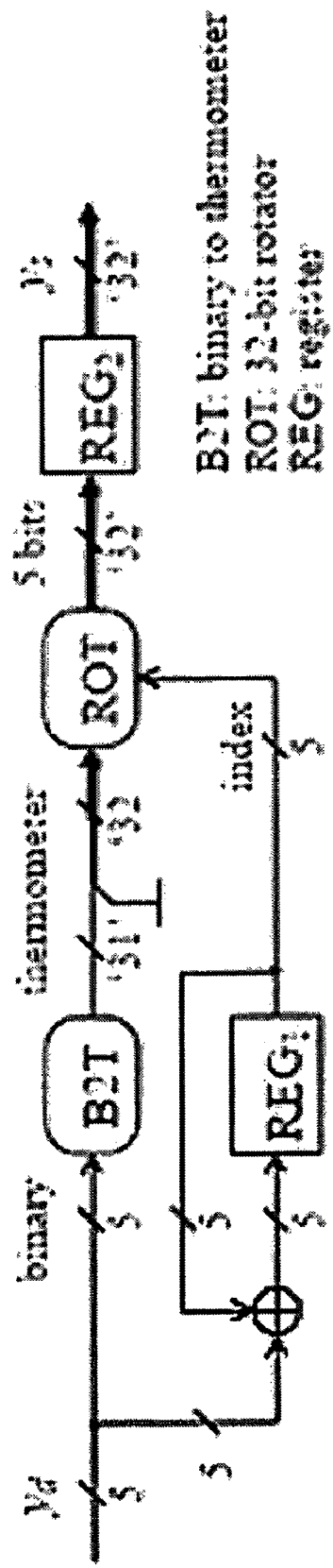
Figure 12E:
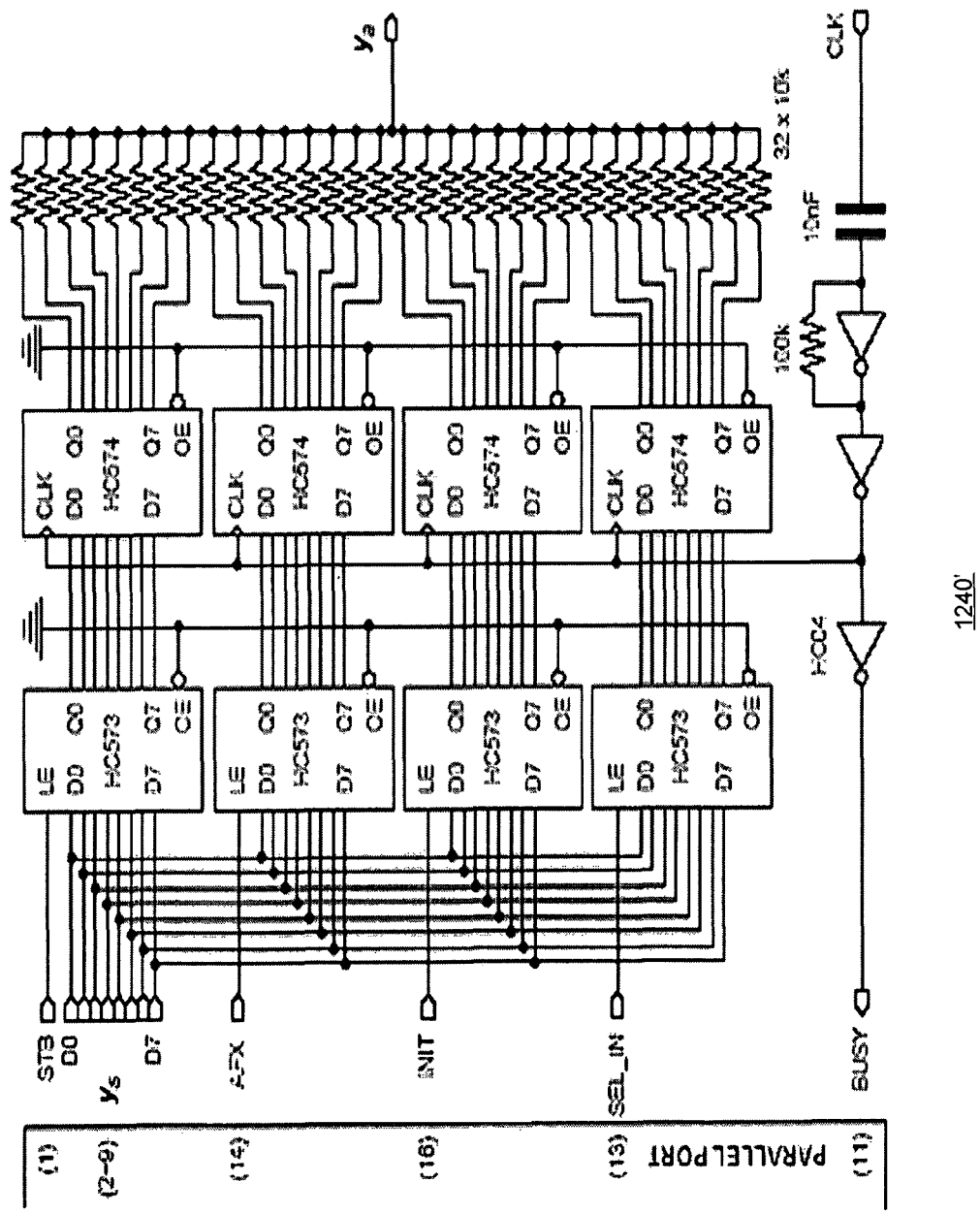

To support the effectiveness of the proposed nonlinearity correction, two low-OSR EF DACs were designed, simulated, built from discrete components, and measured. FIGS. 12A-12E illustrates discrete-components of two $4^{th}$ order 5-bit error-feedback DACs in a manner consistent with the present invention. Specifically, FIG. 12A illustrates a block diagram of a $4^{th}$ order 5-bit error-feedback DAC. FIGS. 12B and 12C are a block diagram representations of a modulator 1220 found in FIG. 12A with an OSR of 4 and an OSR of 8 respectively. FIG. 12D is a block diagram representation of scrambler 1230 found in FIG. 12A. FIG. 12E is a detailed schematic diagram representation of ADAC 1240 found in FIG. 12A.

FIG. 3 may be used as a reference to better define the discrete components of the EF DAC. In particular, modulator 1220 corresponds to (performs the analogous functions of) adder 310, transfer function 380, truncator 320, adder 370, RAM 360, and CADC 350. Scrambler 1230 corresponds to (performs the analogous functions of) the DWA 330. Finally, ADAC 1240 corresponds to (performs the analogous functions of) the ADAC 340.

The core of the EF DACs are the digital delta-sigma modulators. Its 24-bit input $\chi_d$ is provided by a digital sinusoidal generator and its 5-bit output $y_d$ is scrambled prior to being converted into an analog signal $y_a$ by the 32-element ADAC. (FIG. 12A) Both modulators have a 4th-order 5-bit (32-element) architecture with optimized zeros (e.g., as described in the paper R. Schreier, "An empirical study of high-order single-bit delta-sigma modulators," *IEEE Transactions on Circuits and Systems-II: Analog and Digital Signal Processing*, vol. 40, no. 8, pp. 461-466, August 1993 (referred to as "the Schreier paper")), and obey the stability criterion as described in the Kiss paper.

The first example of EF DAC is capable of 62.5 dB of truncation-error limited SNR (10 bits) with an OSR of only 4. Its NTF has two complex-conjugate zero pairs optimally distributed over the signal band (See, e.g., the Schreier paper.), namely, $NTF(z)=1-3.4888\ z^{-1}+5.0089\ z^{-2}-3.4888\ z^{-3}+z^{-4}$. The second example of EF DAC is designed for an OSR of 8. It can achieve 88.9 dB of truncation-error limited SNR (14.5 bits) with $NTF(z)=1-3.8689\ z^{-1}+5.7399\ z^{-2}-3.8689\ z^{-3}+z^{-4}$.

The digital modulator loops were coded in software using integer, 24-bit, arithmetic. Expensive multipliers can be avoided since the NTF's coefficients are easy to implement by shifting and adding/subtracting binary operations $$(3.4888 \cong 4 - \frac{1}{2} - \frac{1}{64}$$

and $5.0089 \cong 4+1$ for an OSR of 4 (FIG. 12B), and $$3.8689 \cong 4 - \frac{1}{8} - \frac{1}{128} + \frac{1}{512} \text{ and}$$

$$5.7399 \cong 4 + 2 - \frac{1}{4} - \frac{1}{64} - \frac{1}{256} + \frac{1}{512}$$

for an OSR of 8 (FIG. 12C)). These approximations give about 0.2 dB drop of SNR from its value achievable with floating-point coefficients.

The truncator is a mere splitting of bits. The five MSBs constitute the modulator's output $y_d$, while the 19-LSB truncation error "$-e_t$" along with the correction term read from the RAM table are fed back into the loop filter H(z). (See FIGS. 12B-12C.)

The discrete-component prototype is shown in FIG. 12E. (See, e.g., the Kiss paper.). The digital logic (the, generator, modulator and scrambler) was implemented using integer arithmetic on a ×86 processor. The 32-line thermometer-coded digital output $y_S$ was interfaced with the 32-resistor ADAC using the parallel port of a personal computer (PC) and eight 8-bit buffers. The common node of the resistors provides the analog output $y_a$ of the EF DAC. The timing of the circuit is controlled by an accurate external clock (CLK).

The discrete-component experimental setup mimics an IC. The sampling rate of the DAC was limited to 64 kHz by the parallel port of the PC used in the experiment.

Figure 13A:
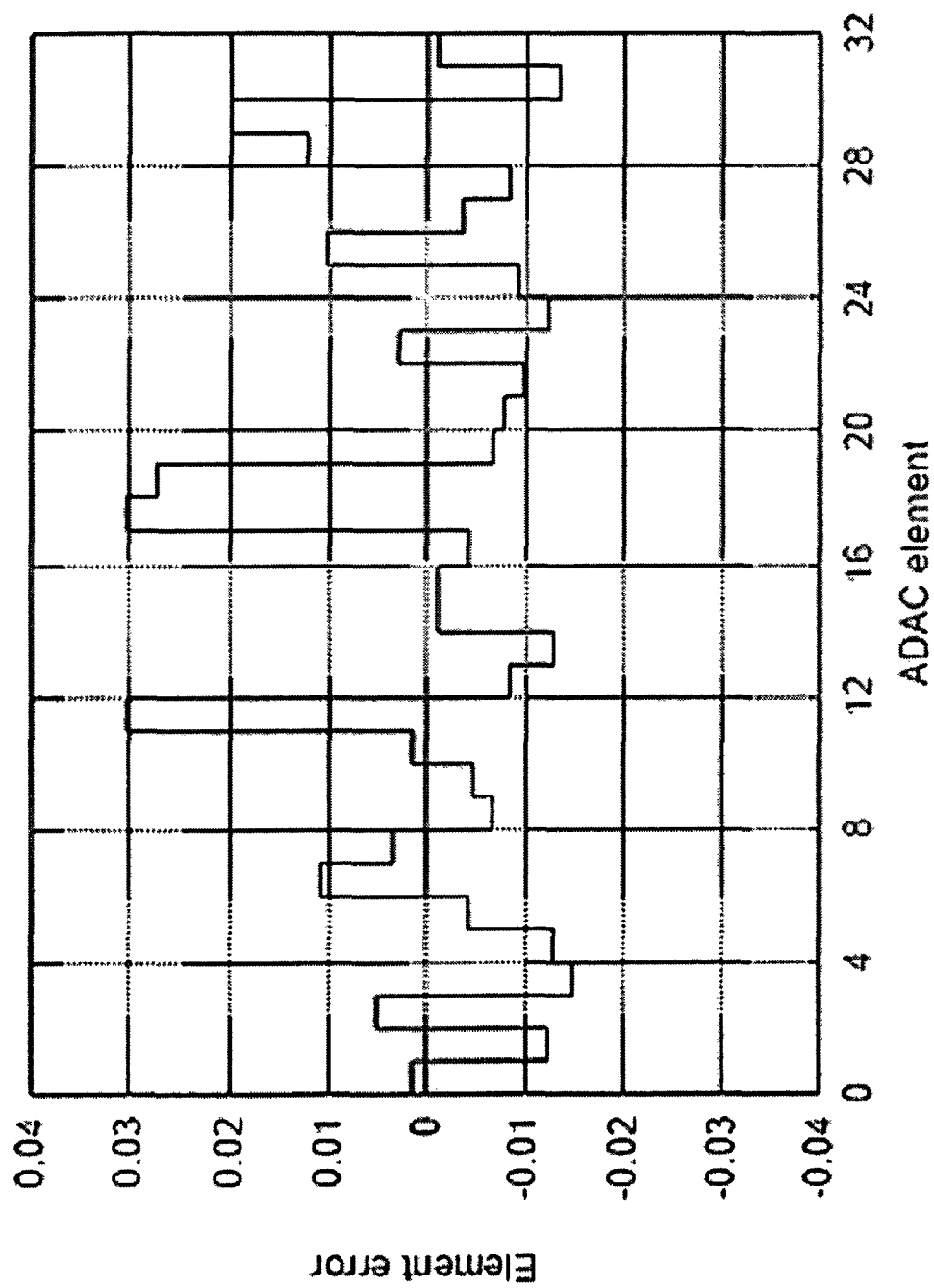
FIG. 13A is a graphical illustration of measured unit-element errors $e_{ue}$ of a 32-element ADAC in a manner consistent with the present invention.
Figure 13B:
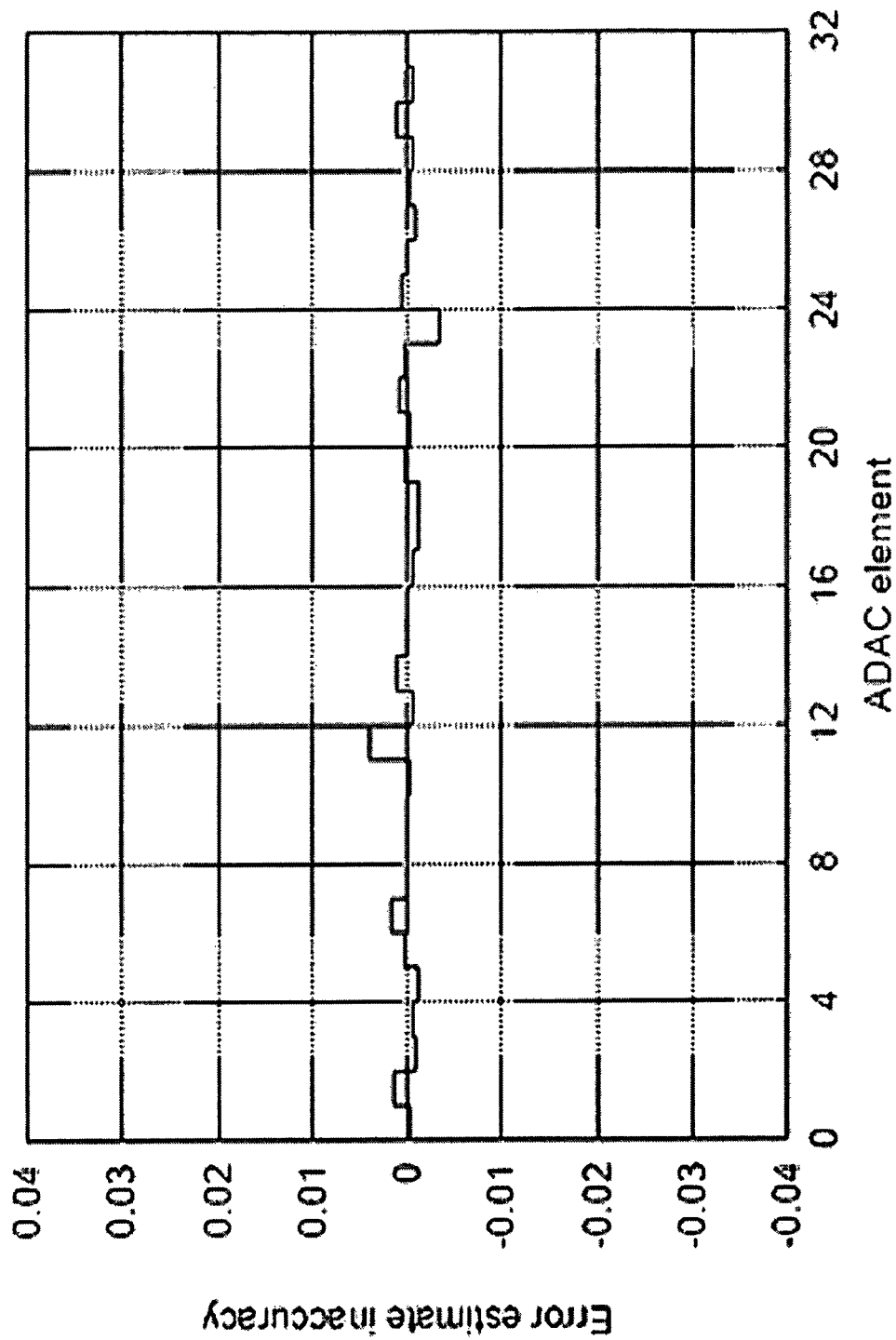
FIG. 13B is a graphical illustration of assumed error estimate inaccuracies $\delta e_{ue}$ of a 32-element ADAC in a manner consistent with the present invention.

In all simulations and measurements a nonlinear ADAC is used. This thermometer-code 5-bit ADAC uses CMOS registers and 32 identical resistors with 3% tolerance. (See FIG. 12E.) Each unit element was measured by a high-accuracy digital multi-meter. The measured unit-element errors $e_{ue}$ of the resistor-string ADAC are shown in FIG. 13A. In order to account for the potential inaccuracies in the nonlinearity-error estimates due to CADC, an intentional error $\delta e_{ue}$ with a standard deviation $\sigma e_{ue}$ corresponding to a 3-bit CADC is included into simulations. (See FIG. 13B.) The same nonlinearities $e_{ue}$, captured by measurements (FIG. 13A), are used in simulations to compare simulation results with experimental data.

The nonlinearity errors $e_{nl}$ of the ADAC are corrected by the digital correction technique consistent with the present invention (FIG. 7) enhanced by the first-order mismatch shaping offered by DWA. (See, e.g., the Baird paper.) The DWA scrambler rotates the thermometer-coded word using a barrel shifter. (See ROT in FIG. 12D.) A 5-bit register (REG1) holds the rotation index which is incremented by the output value of each sample $y_d$. Due to the circular nature of the rotator, the index adder truncates its output to 5 bits. The last register (REG2) of the scrambler avoids data-dependent delays in the signal path.

In the following subsections, simulation and experimental results are presented. During the measurements, the analog output signal $y_a$ of the modulator was captured using a high-performance data acquisition card capable of handling audio-range signals with more than 105 dB of SNDR. The captured analog samples were post processed with a PC to obtain the SNDR and SNR values from the resulting spectra.

§4.3.1 Simulated 10-Bit DAC (OSR of 4)

Figure 14A:
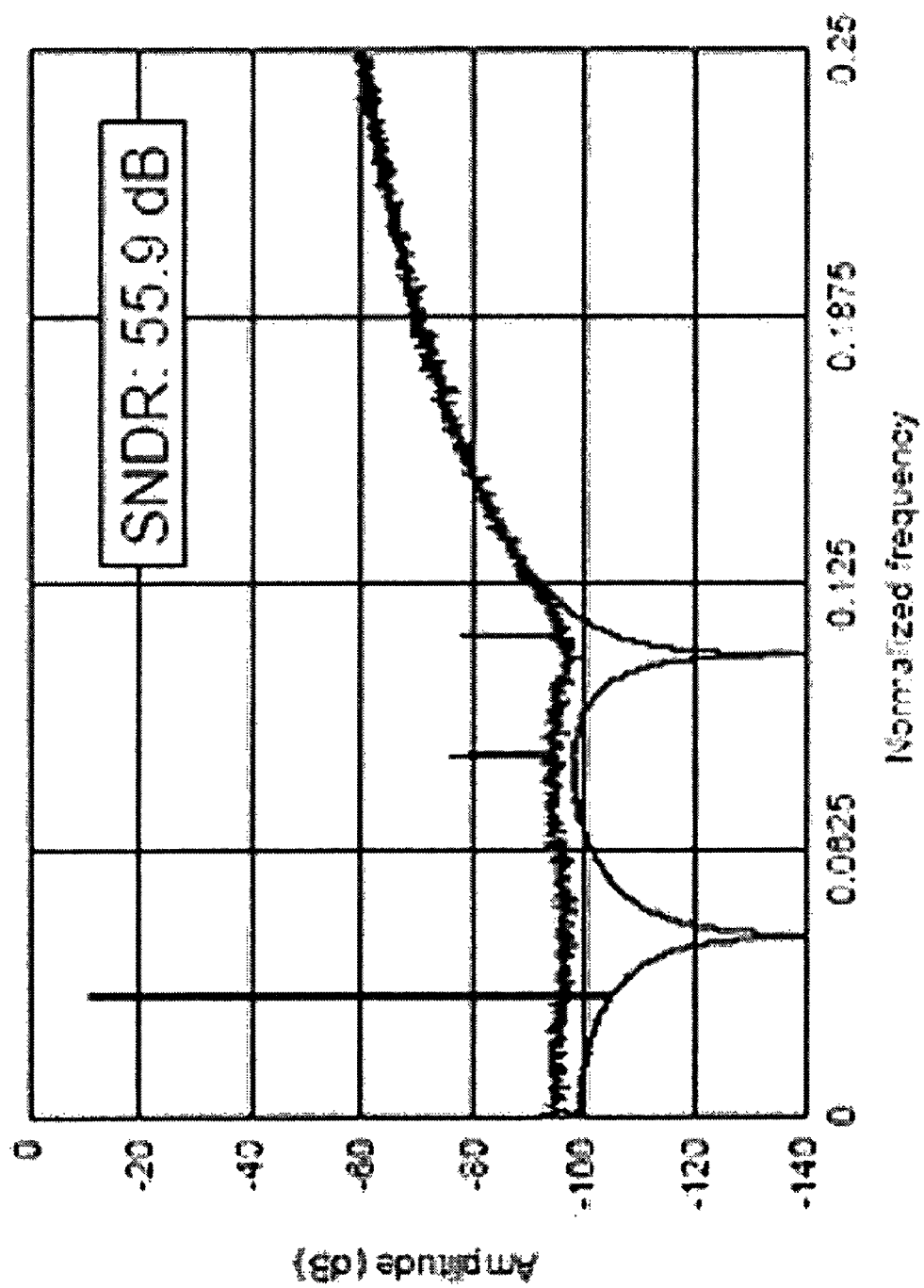
FIGS. 14A-14D are graphical illustrations of simulated spectra for an OSR of 4 and 3-bit CADC: without any correction; with DWA, algorithm correction; with INL correction; and with combined INL correction with DWA, respectively.
Figure 14B:
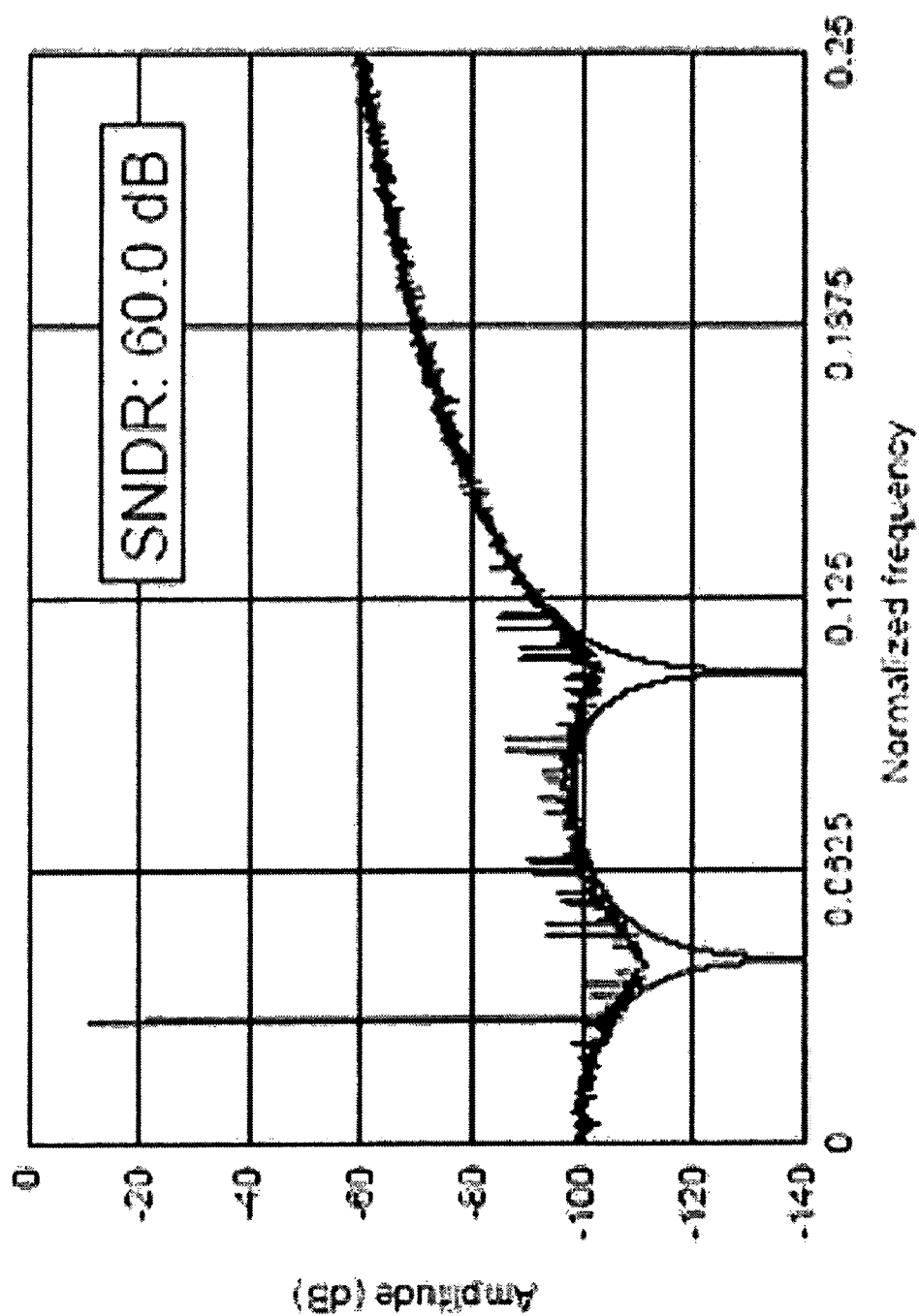

The simulation results for an OSR of 4 are presented in FIGS. 14A-14D. The spectrum shows some harmonic content and a high noise floor when no correction is used (FIG. 14A). The effect of the ADAC mismatches is attenuated by 4.1 dB when the DWA algorithm is activated (FIG. 14B). However, some spurious tones are present due to the tonal behavior of the first-order mismatch-shaping algorithm. (See, e.g., the paper, R. E. Radke, A. Eshraghi, and T. S. Fiez, "A 14-bit current-mode sigma-delta DAC based upon rotated data weighted averaging," *IEEE Journal of Solid-State Circuits*, vol. 35, no. 8, pp. 1074-1084, August 2000.)

Figure 14C:
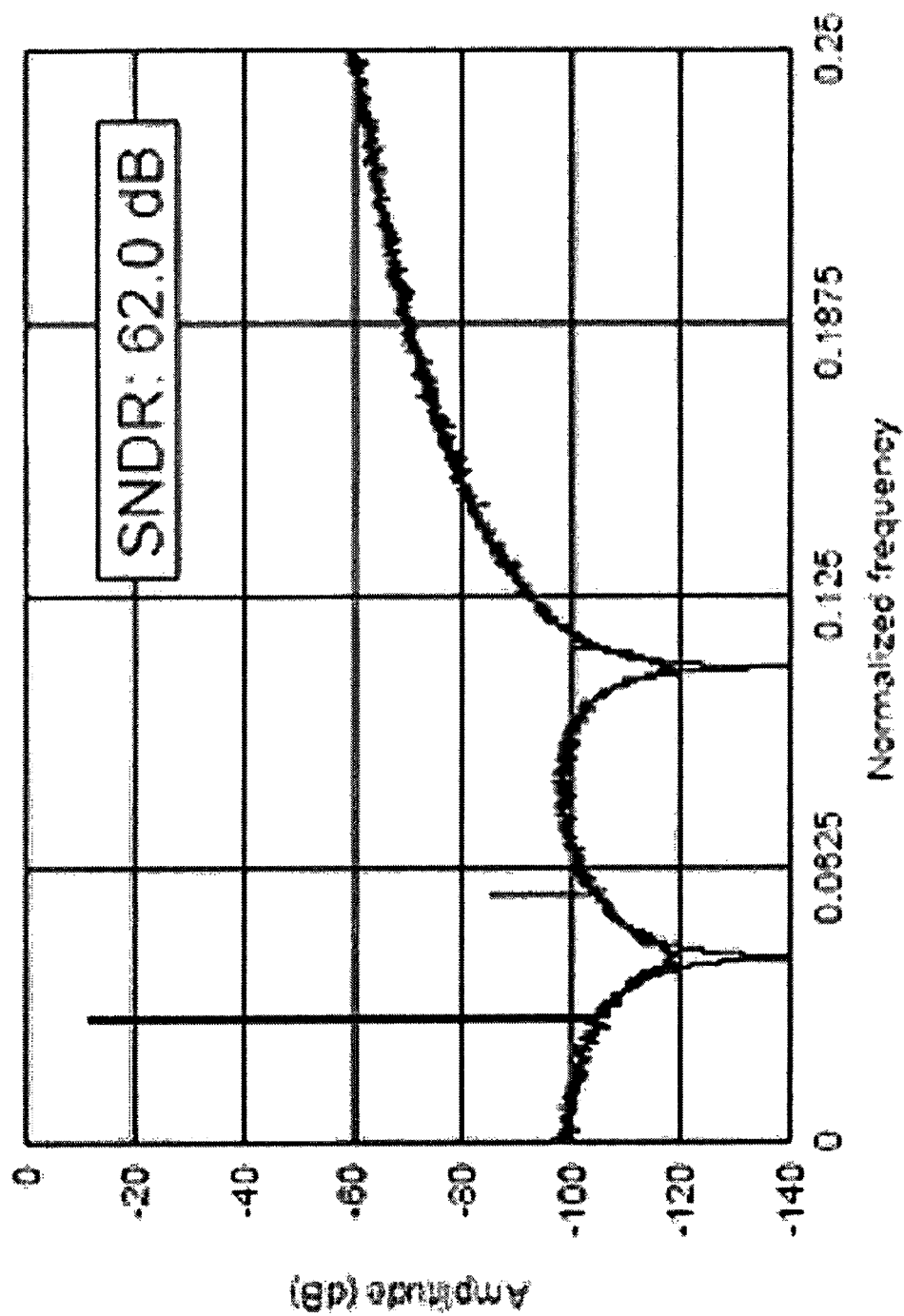

The results obtained using the proposed INL correction are shown in FIG. 14C. With a 3-bit CADC the resulting spectrum and SNDR of 62.0 dB is almost that of the ideal modulator, as expected from FIG. 9. The two notches of the NTF are clearly visible. A second harmonic is still present, but its power is well below the noise floor of the truncation error. The obtained SNDR of 62.0 dB is almost that of the ideal modulator.

Figure 14D:
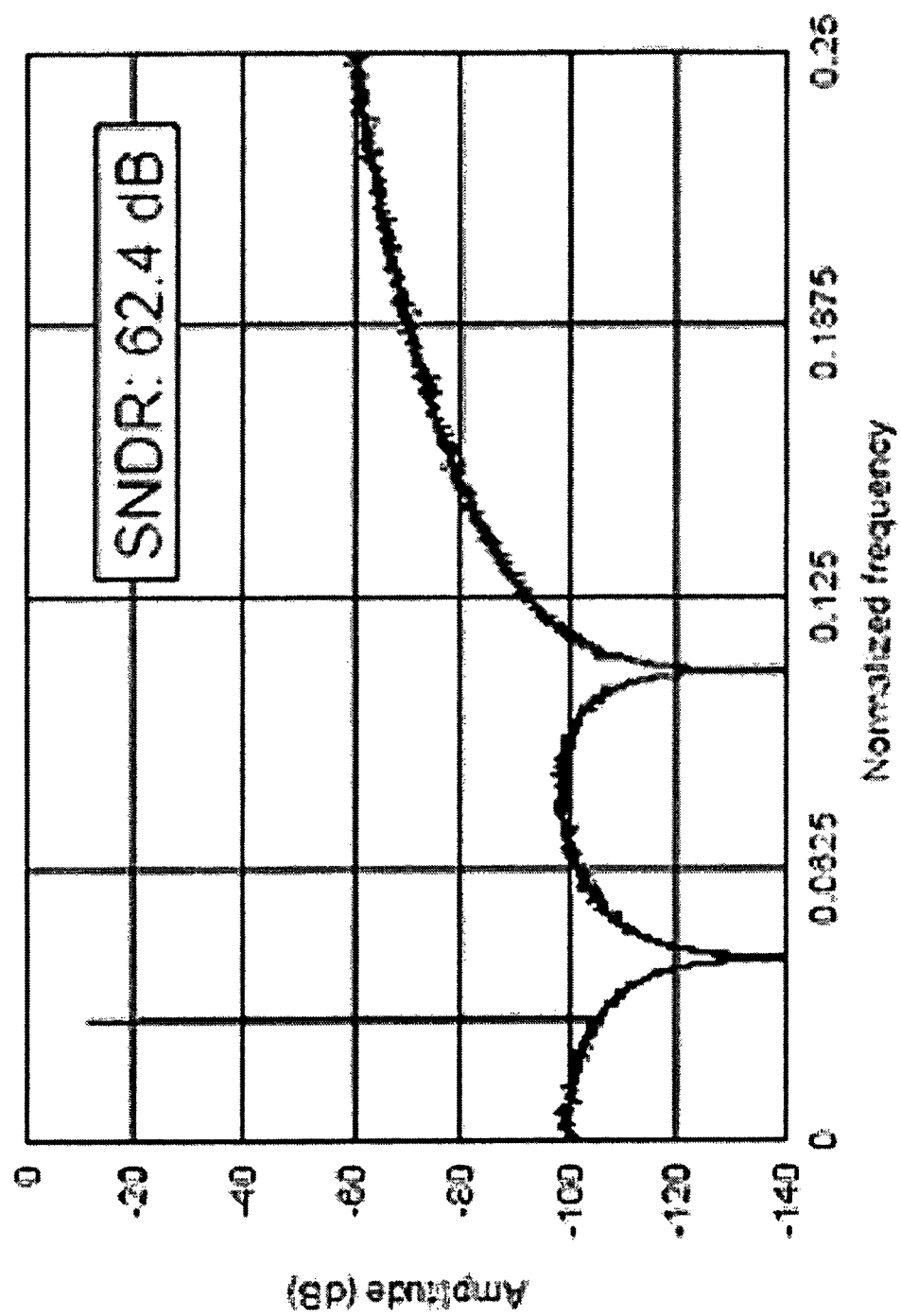

Finally, the results obtained by using the INL correction combined with the DWA algorithm are shown in FIG. 14D. The harmonic distortion is no longer visible and the two NTF notches are deeper than those of FIG. 14C. However, the achieved SNDR improvement of 0.4 dB is not significant.

§4.3.2 Simulated 14-Bit DAC (OSR of 8)

The simulation results for an OSR of 8 are presented in FIGS. 15A-F. To clearly identify the dominant error components in the spectra, Equation (4) was reproduced and visually confirmed by simulations in FIGS. 15E and 15F for the INL correction (FIG. 15C) and for the INL correction with DWA (FIG. 15D) scenarios, respectively.

Figure 15A:
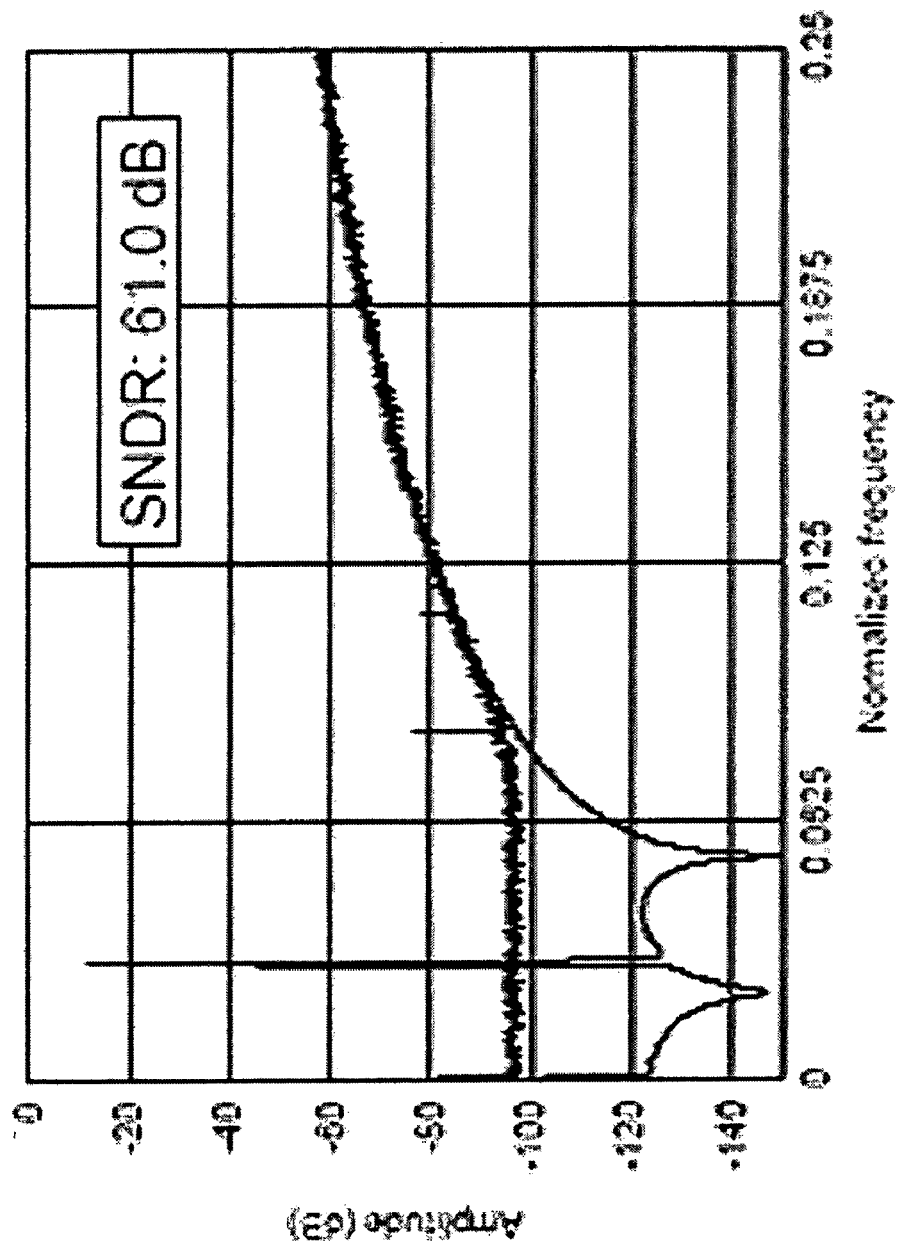
FIGS. 15A-15F are graphical illustrations of simulated spectra for an OSR of 8 and 3-bit CADC: without any correction; with DWA algorithm correction; with INL correction; with combined INL correction with DWA; with INL correction (showing error component); and with combined INL correction with DWA (showing error component), respectively.

FIG. 15A shows the spectrum obtained when no correction is used. The high noise floor lowers the SNDR value to 61.0 dB, that is, 27.9 dB below that of an ideal modulator. Thus, in effect, 4.3 bits are lost due to the nonlinearity of the ADAC.

Figure 15B:
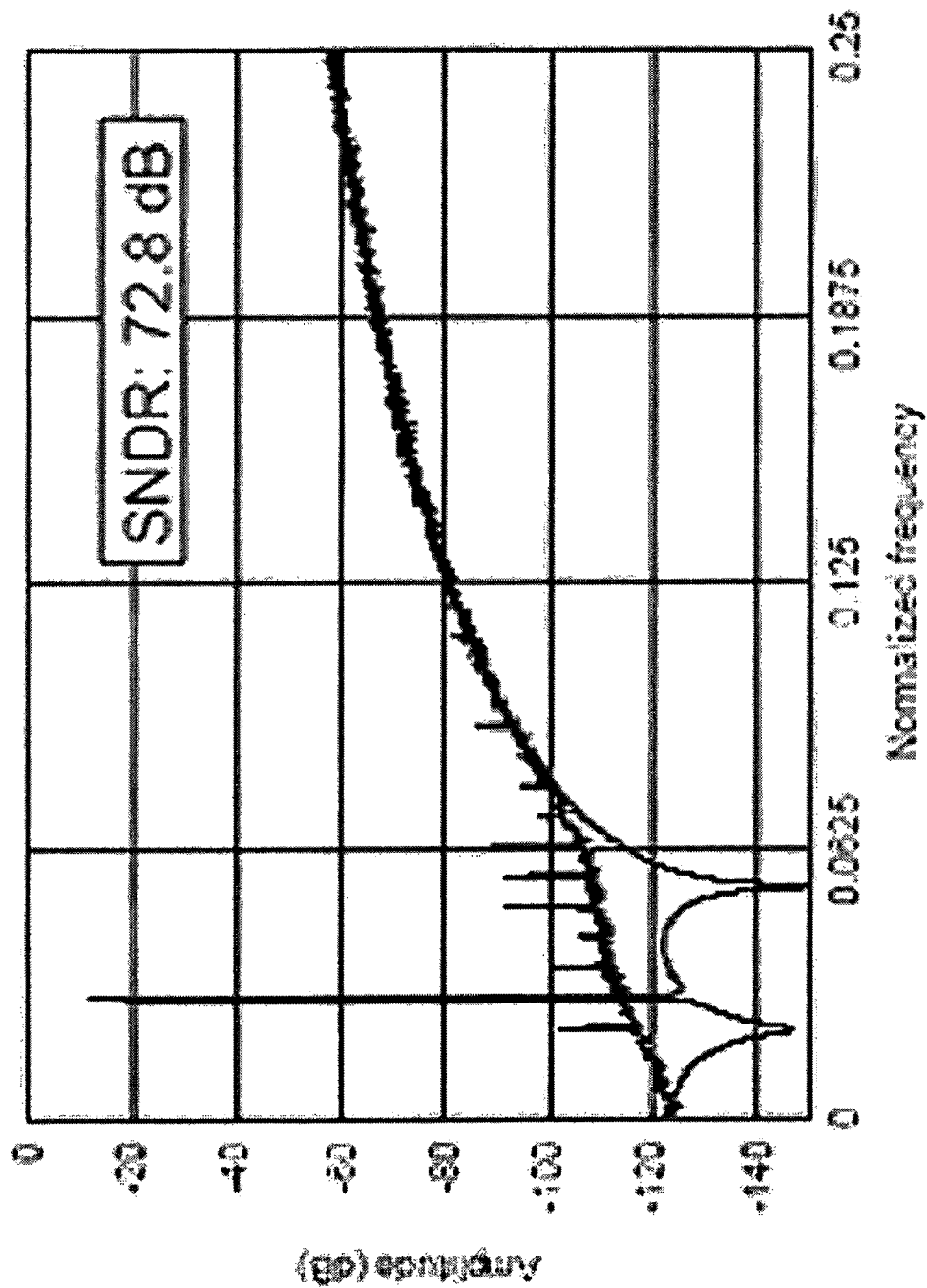

The spectrum obtained using the DWA algorithm is shown in FIG. 15B. In this case, the noise floor shows the expected frequency dependence related to the first-order shaping of the DWA algorithm. However, the noise and distortion are still too high to achieve a performance close to that of an ideal modulator. This causes an effective loss of 2.4 bits. This result confirms that first-order mismatch shaping is not effective enough at such a low OSR.

Figure 15C:
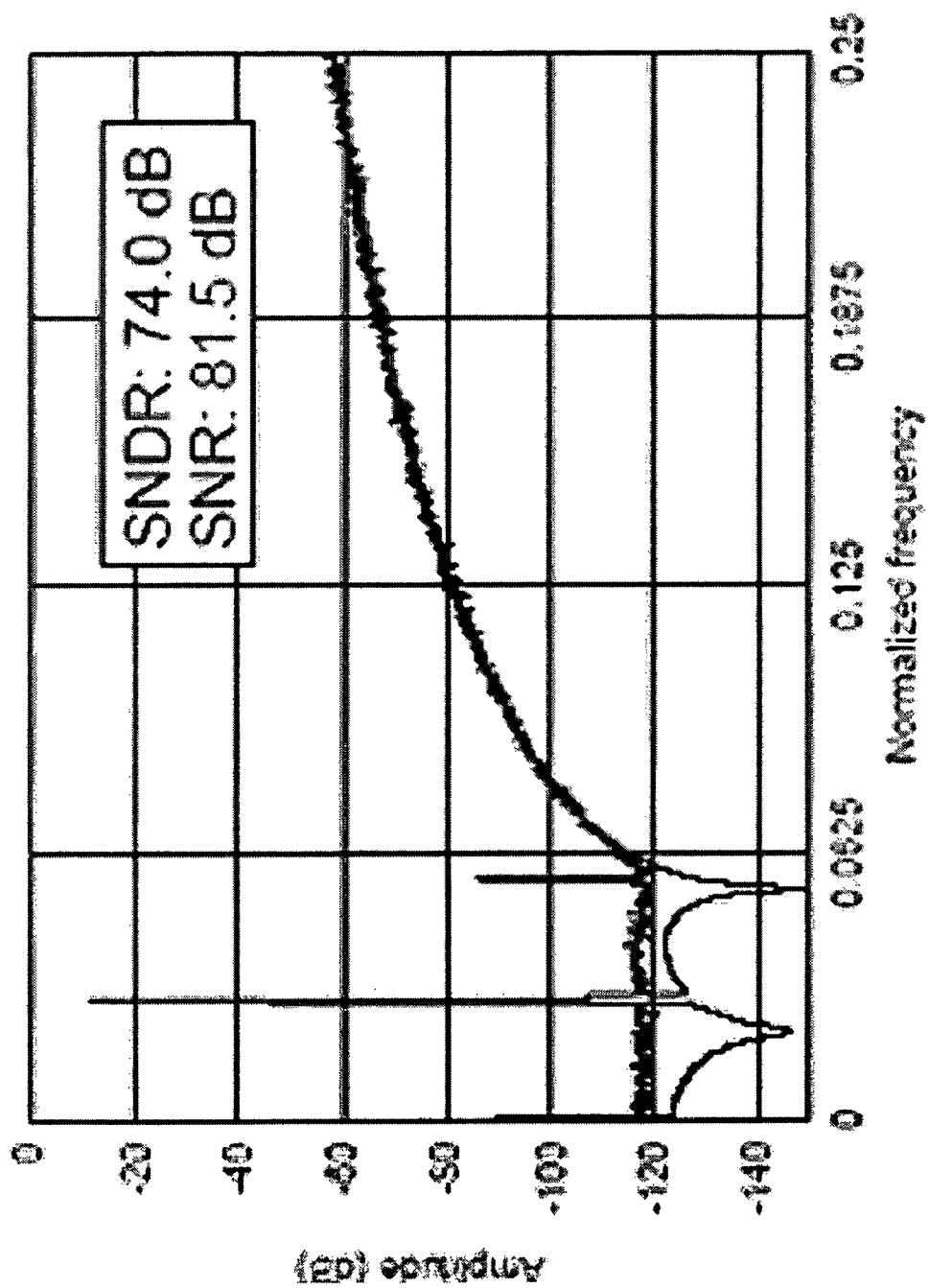

The results obtained using the INL correction method are shown in FIG. 15C. With a 3-bit CADC the resulting spectrum shows a flat noise floor and a second harmonic caused by the inaccuracies $\delta e_{n1}$ affecting the nonlinearity error's estimate $\hat{e}_{n1}$ used in the correction (See FIG. 15E.) The distortion introduced by the second harmonic lowers the SNDR value to 74.0 dB while the SNR is 81.5 dB. This result is comparable with that achieved with the DWA (FIG. 15B).

Figure 9:
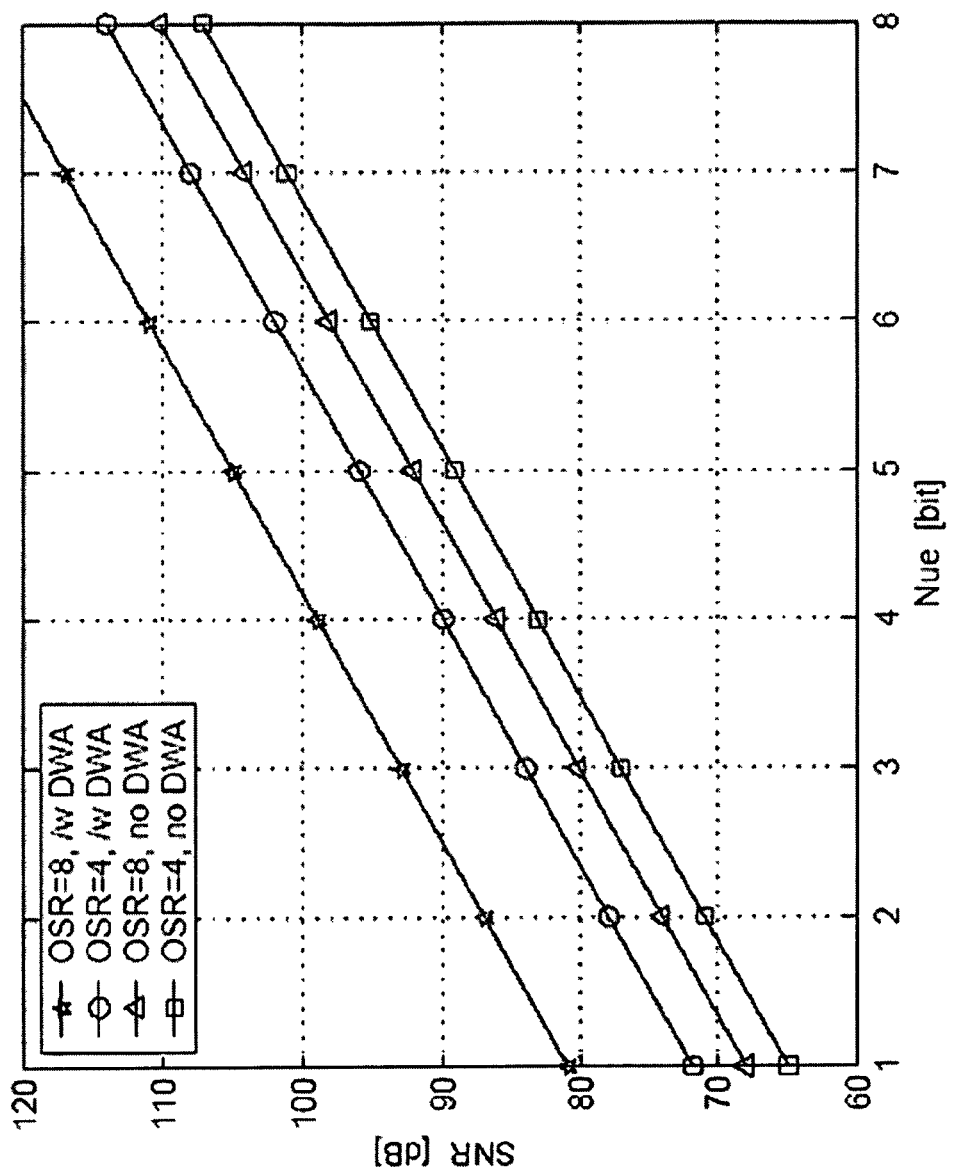
FIG. 9 is a graphical illustration of the effect of the error-estimation accuracy on the corrected DAC's performance for an OSR of 4 and 8, N of 5 bits, and for various resolution of CADC.

Note that using Equation (13) and FIG. 9, an SNR of 80.0 dB can be expected for this scenario, which is pretty similar with the simulated 81.5-dB value. Since the calculations of section 4.2.2 assumed white power spectral density for the error components, the SNDR of 74.0 dB could not be predicted. However, when the ADAC elements are scrambled, the spectrum gets whitened and the predictions become more reliable.

Figure 15D:
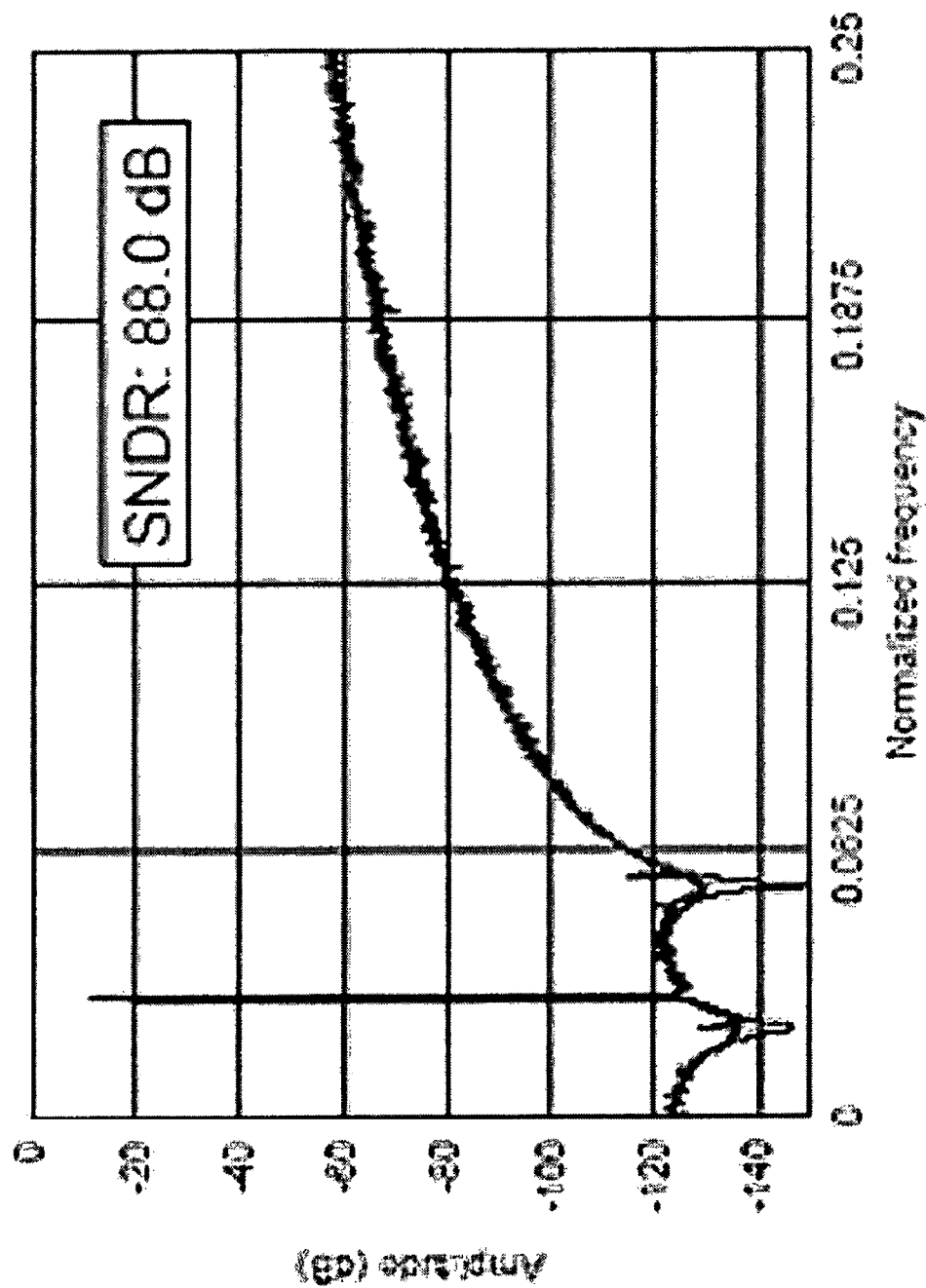
Figure 15E:
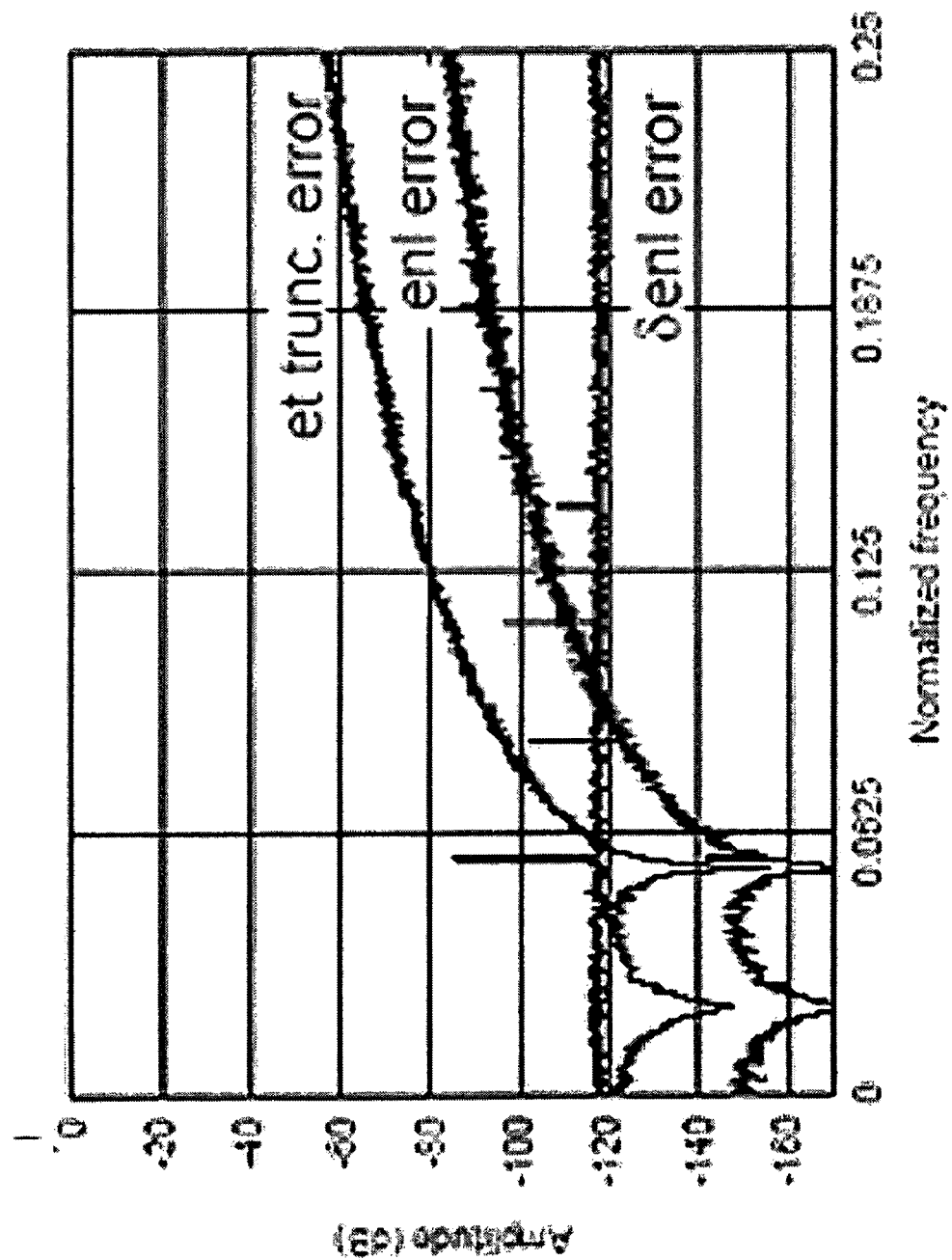
Figure 15F:
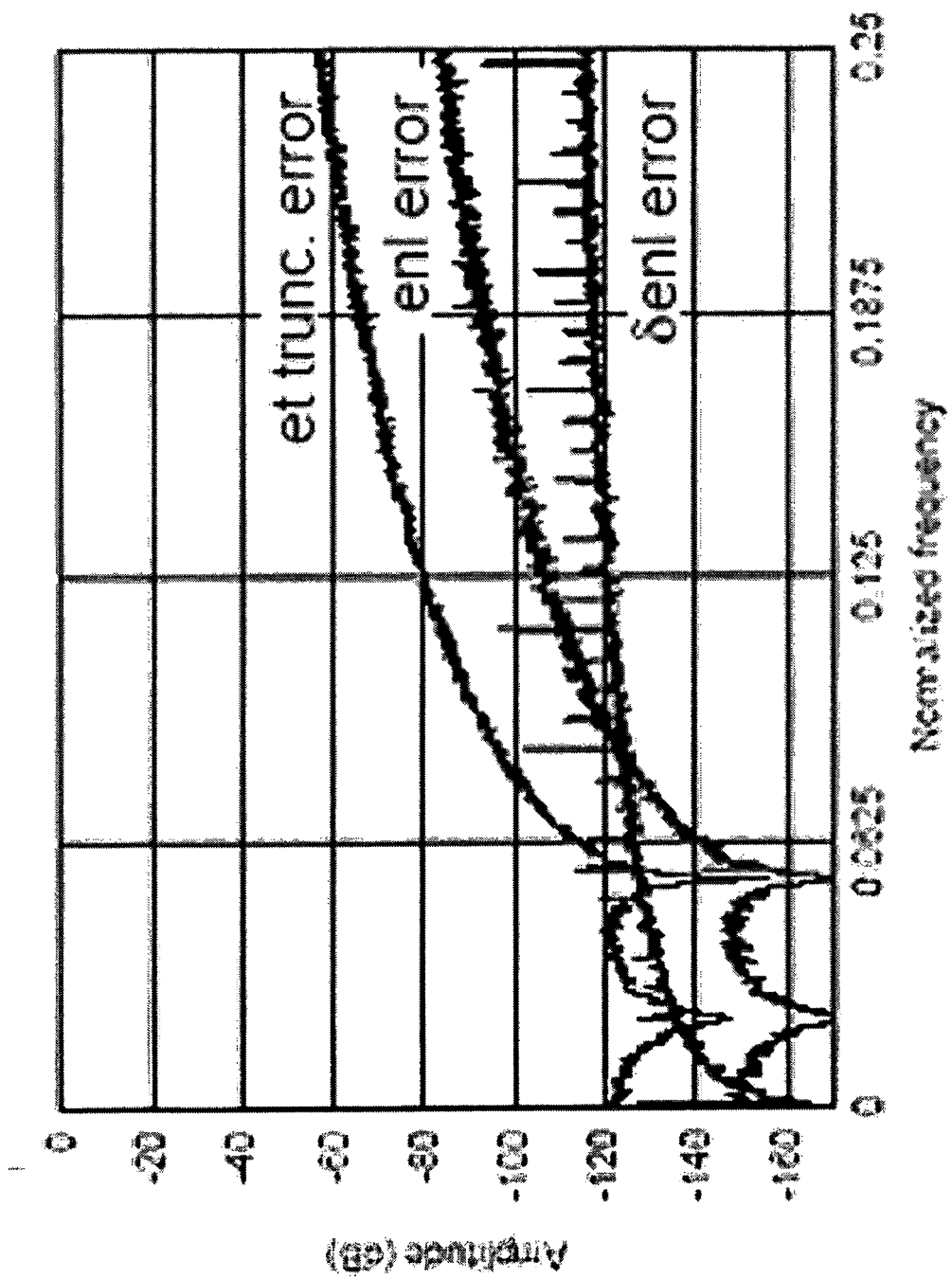
Figure 16A:
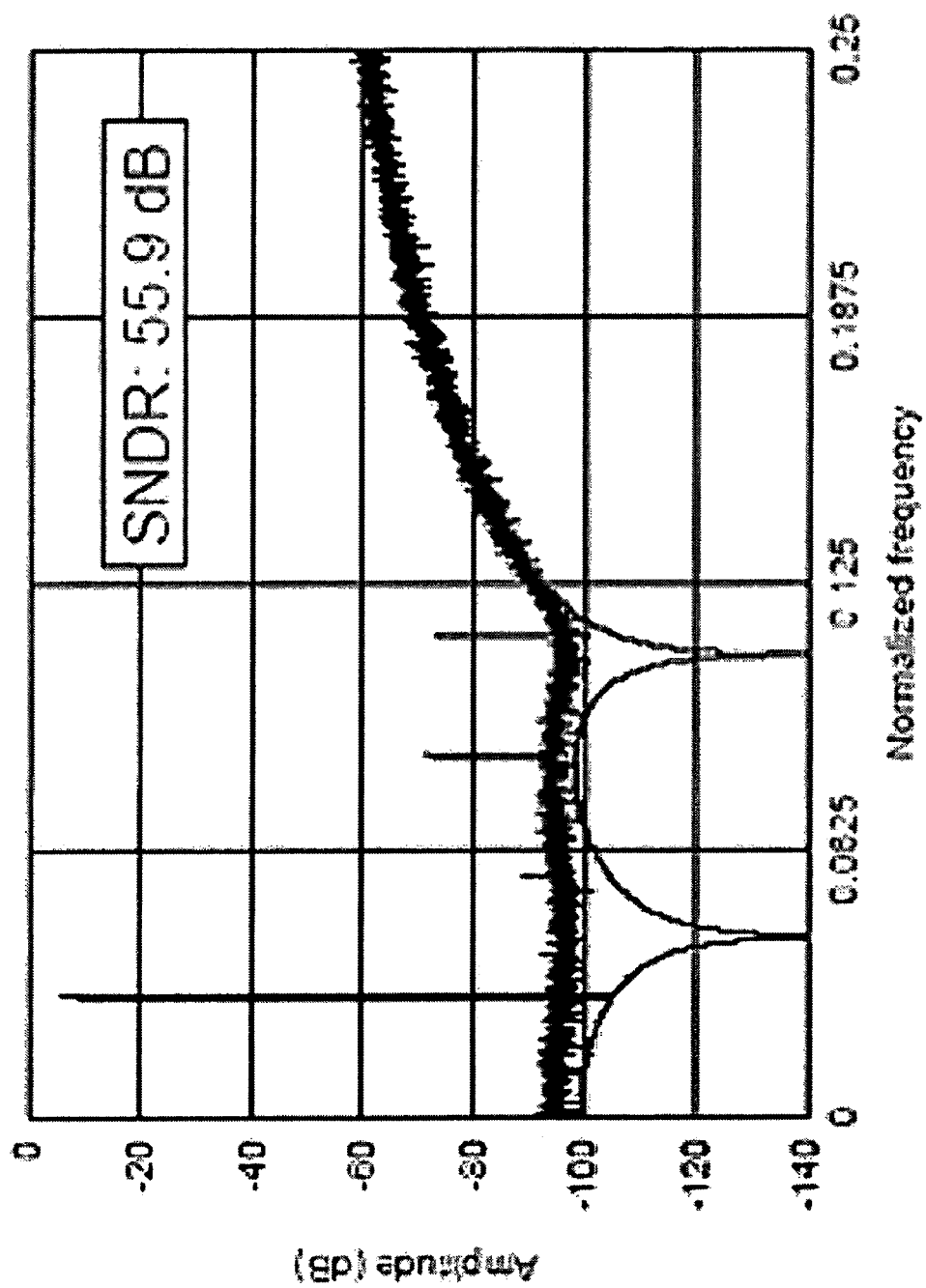
FIG. 16A-16D are graphical illustrations of measured spectra for an OSR of 4: without any correction; with DWA algorithm correction; with INL correction; and combined INL correction with DWA, respectively.
Figure 16B:
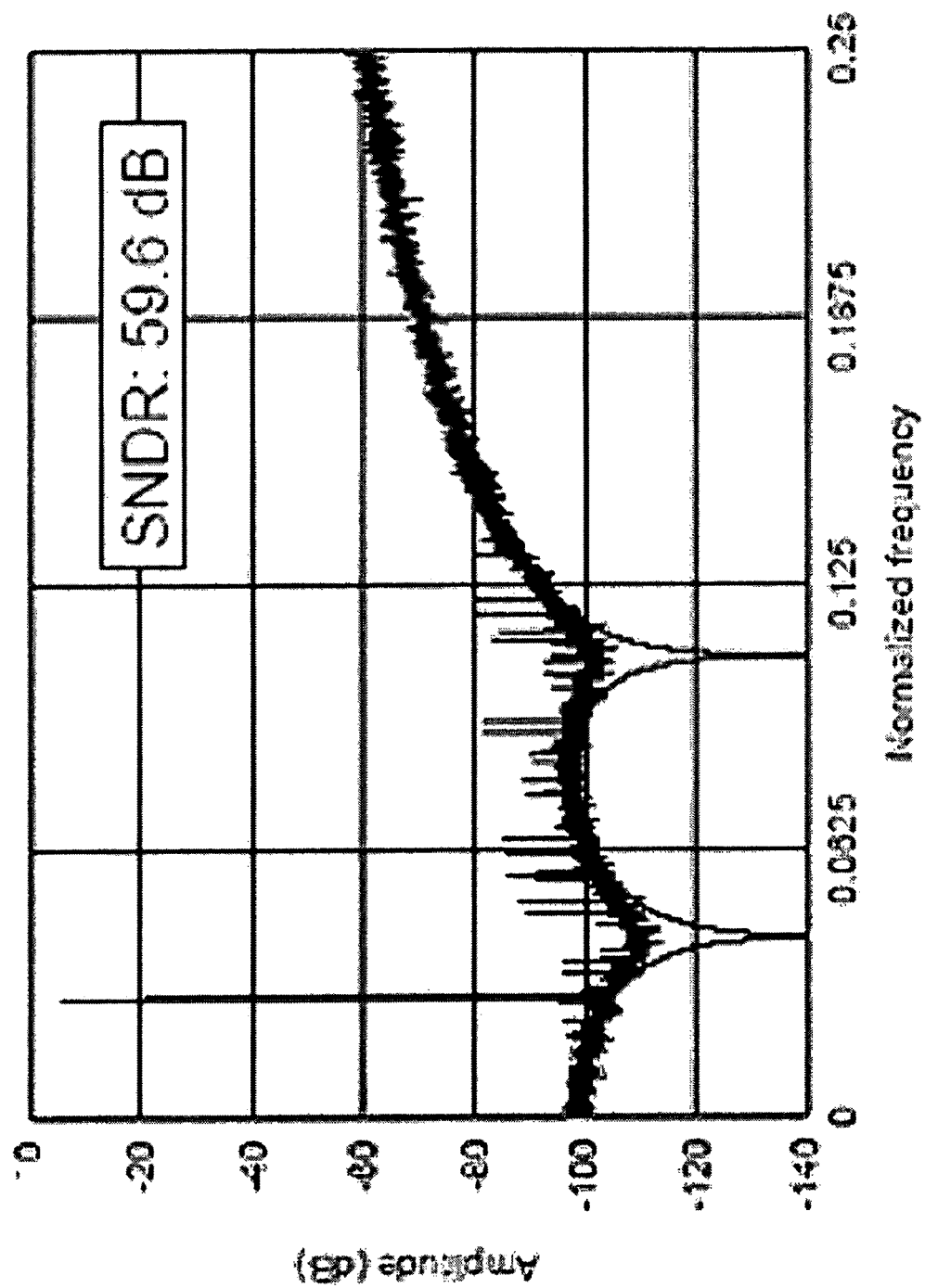
Figure 16C:
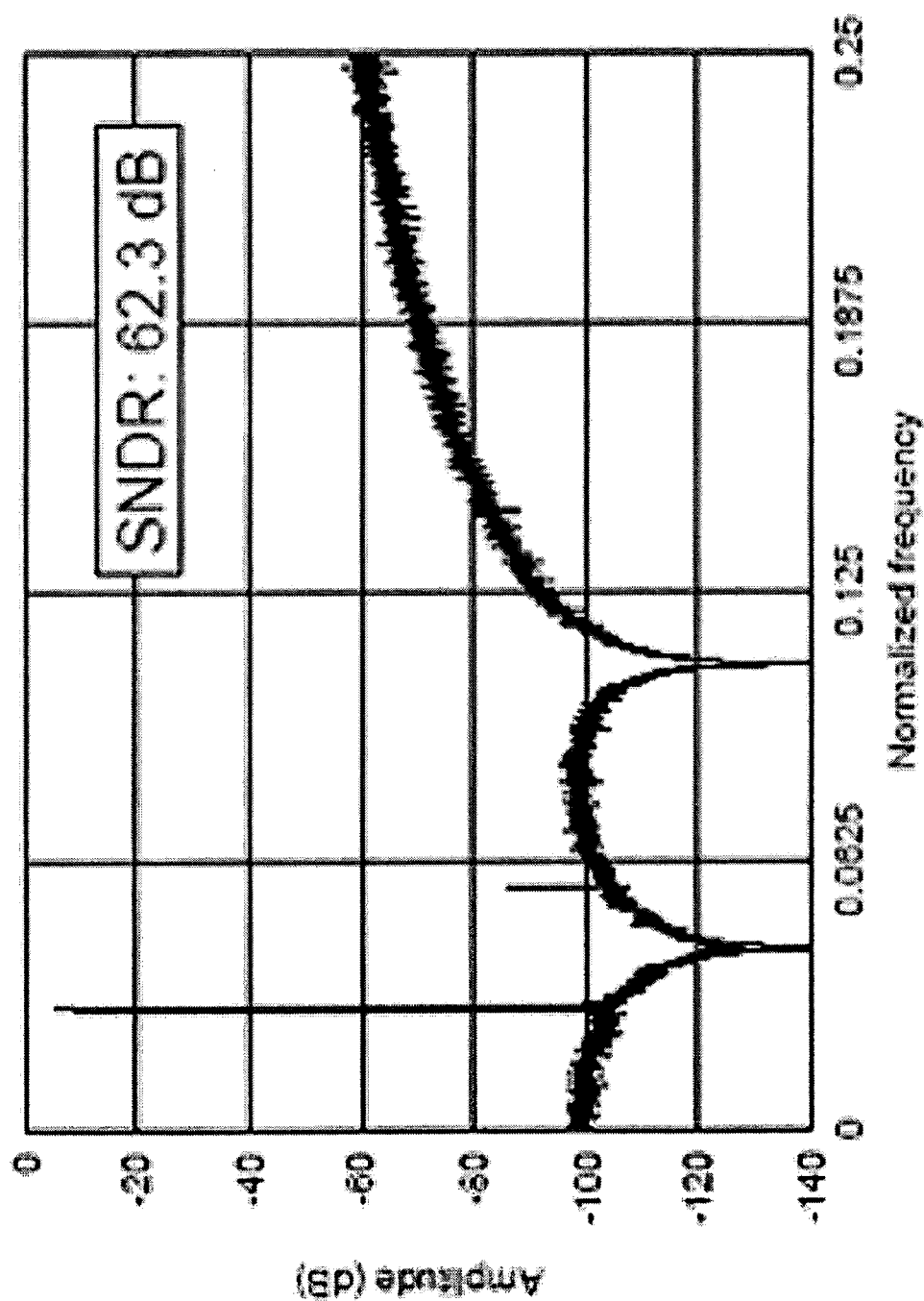
Figure 16D:
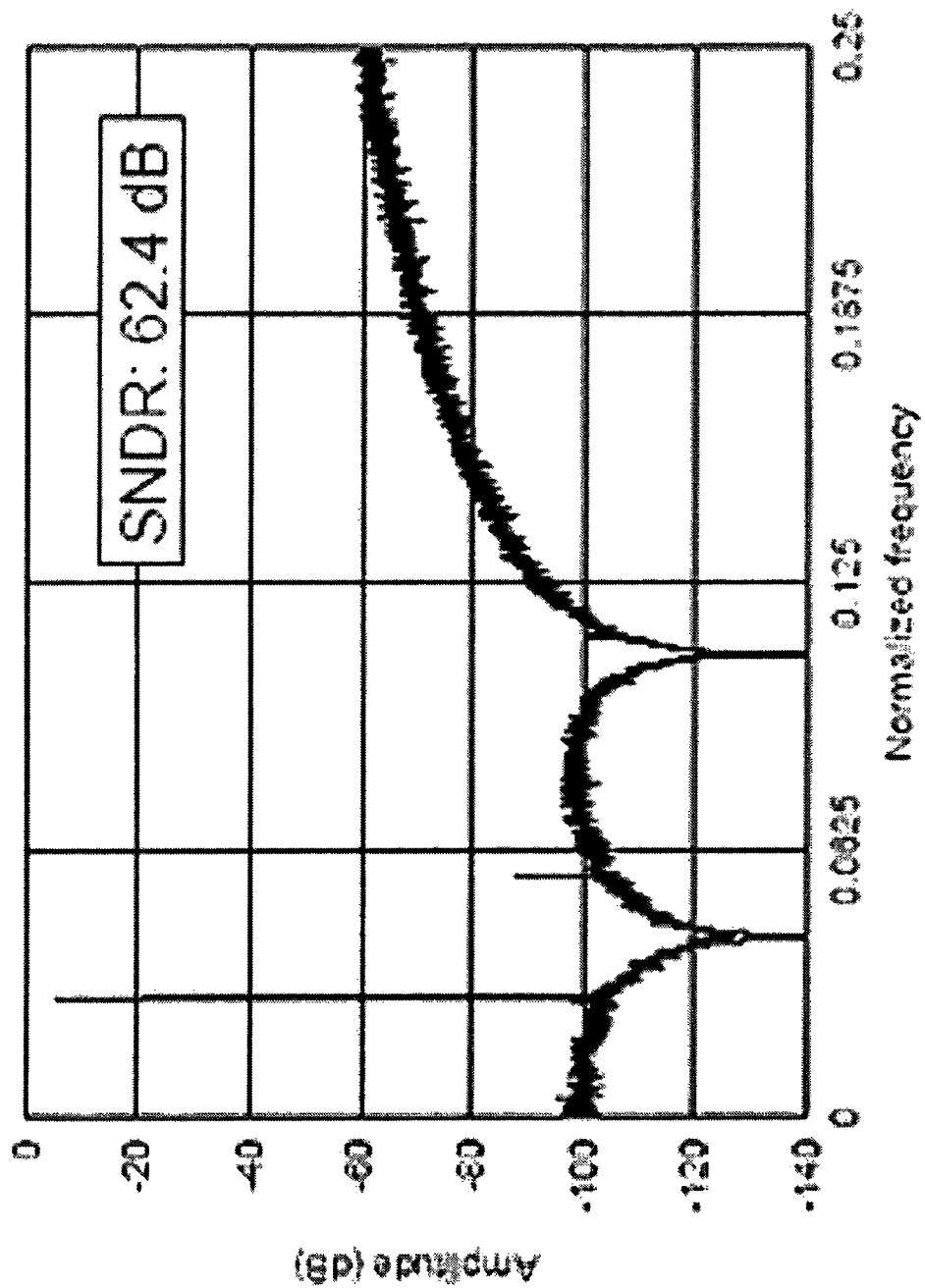

Finally, the results obtained by using the INL correction combined with the DWA algorithm are shown in FIGS. 15D and 15F. The resulting spectrum is close to that of the ideal modulator, even for a 3-bit CADC. The SNDR loss from the ideal value is 0.9 dB, as could be predicted exactly by Equation (14) and FIG. 9.

§4.3.3 Measured 10-Bit DAC (OSR of 4)

The experimental results obtained for an OSR of 4 are shown in FIGS. 16A-16D. These spectra are in good agreement with the simulated results (FIGS. 14A-14D). With respect to FIG. 16C, the experimental spectrum is closer to the ideal than the simulated one (Compare FIG. 14C.) since the experimental estimates $\hat{e}_{n1}$ are not disturbed by the random inaccuracies $\delta e_{n1}$. When INL correction is combined with the DWA algorithm, the experimental spectrum (FIG. 16D) still shows a small second-harmonic distortion, but this does not degrade the SNDR value of 62.4 dB which is 0.1 dB less than that of an ideal modulator.

§4.3.4 Measured 14-Bit DAC (OSR of 8)

The results obtained for an OSR of 8 are presented in FIGS. 17A-17D. Due to the expected high resolution of this converter, the effects of analog-circuit imperfections of the experimental setup become visible and dominant in some spectra.

Figure 17A:
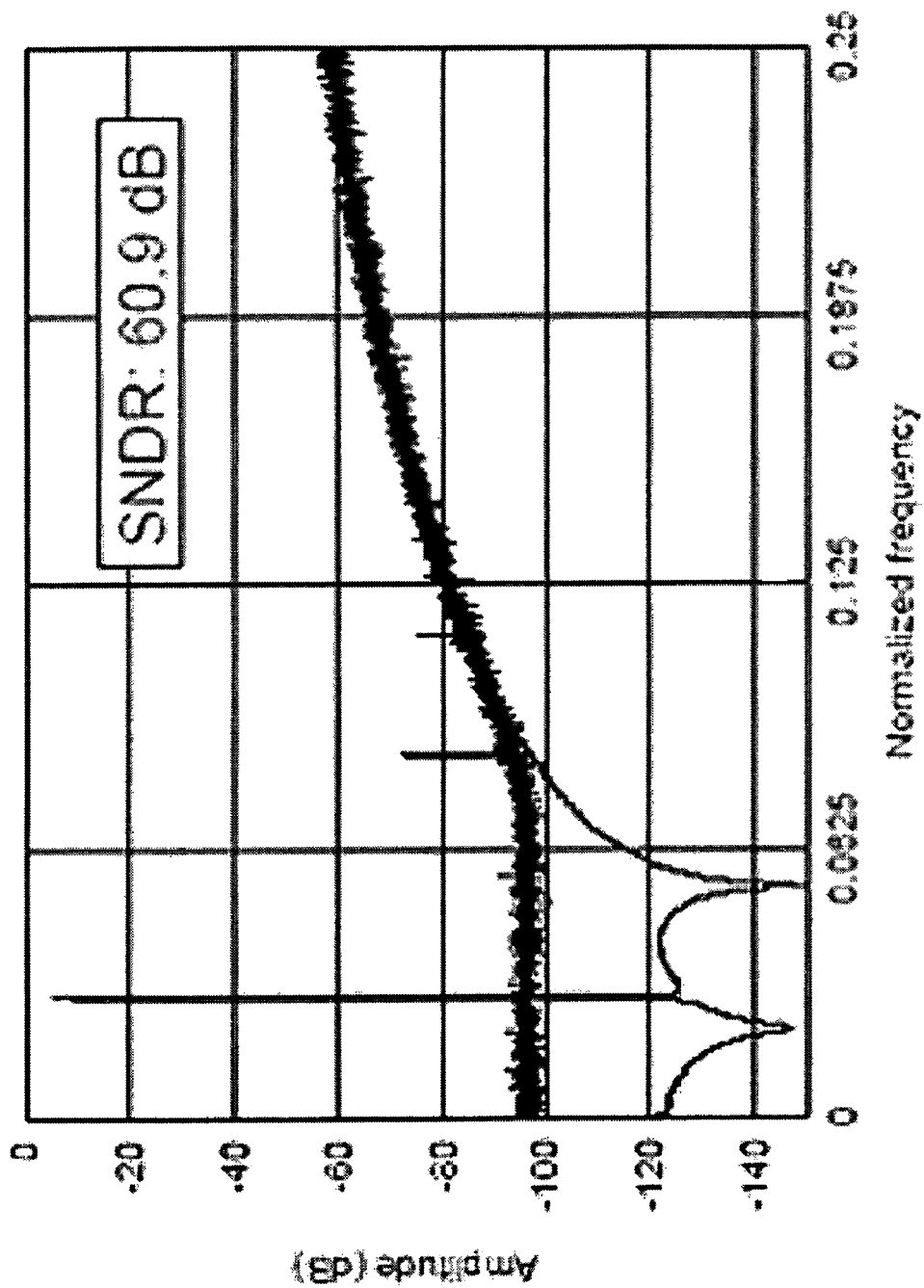
FIG. 17A-17D are graphical illustrations of measured spectra for an OSR of 8: without any correction; with DWA algorithm correction; with INL correction; and with combined INL correction with DWA, respectively.
Figure 17B:
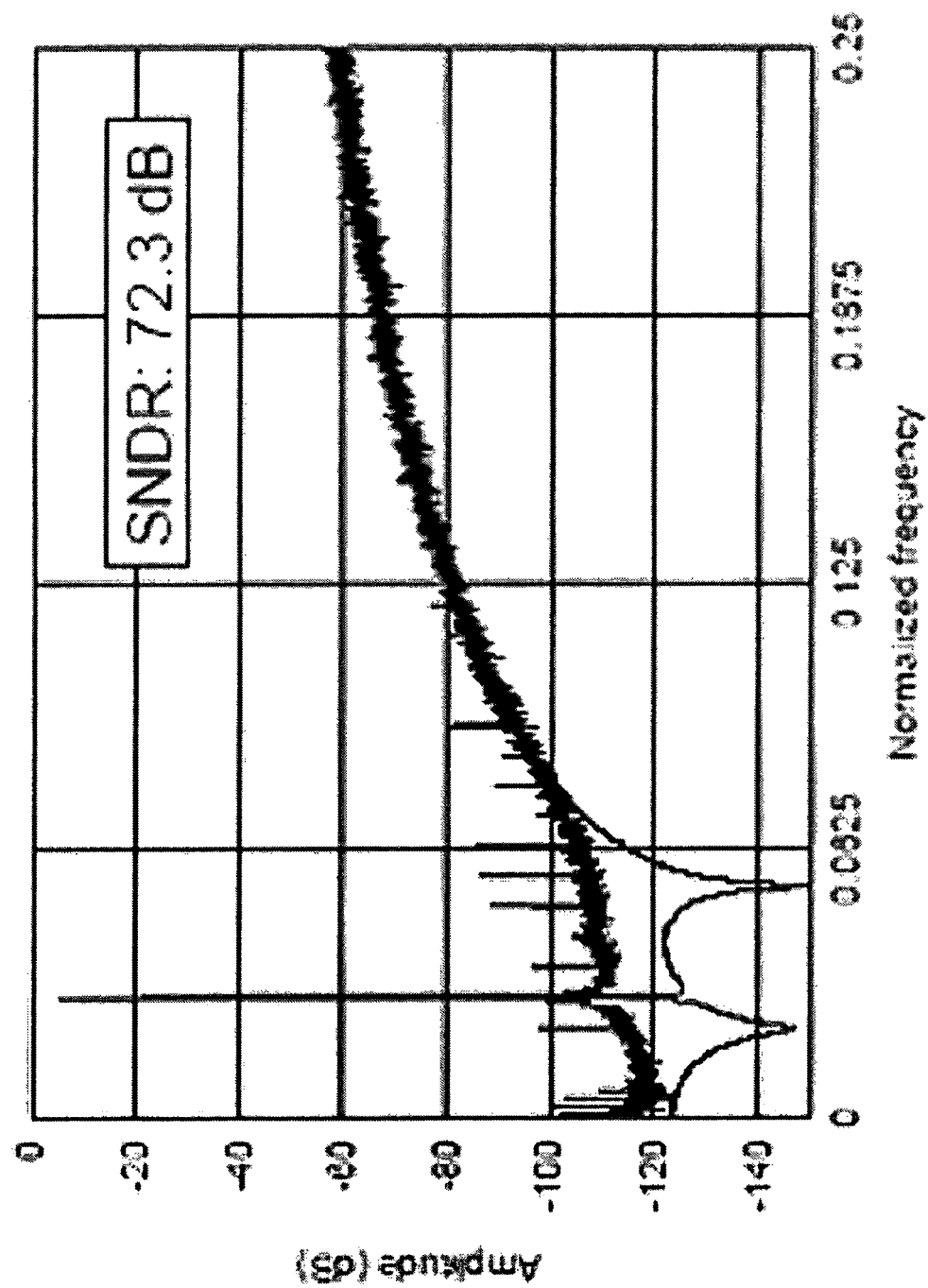
Figure 17C:
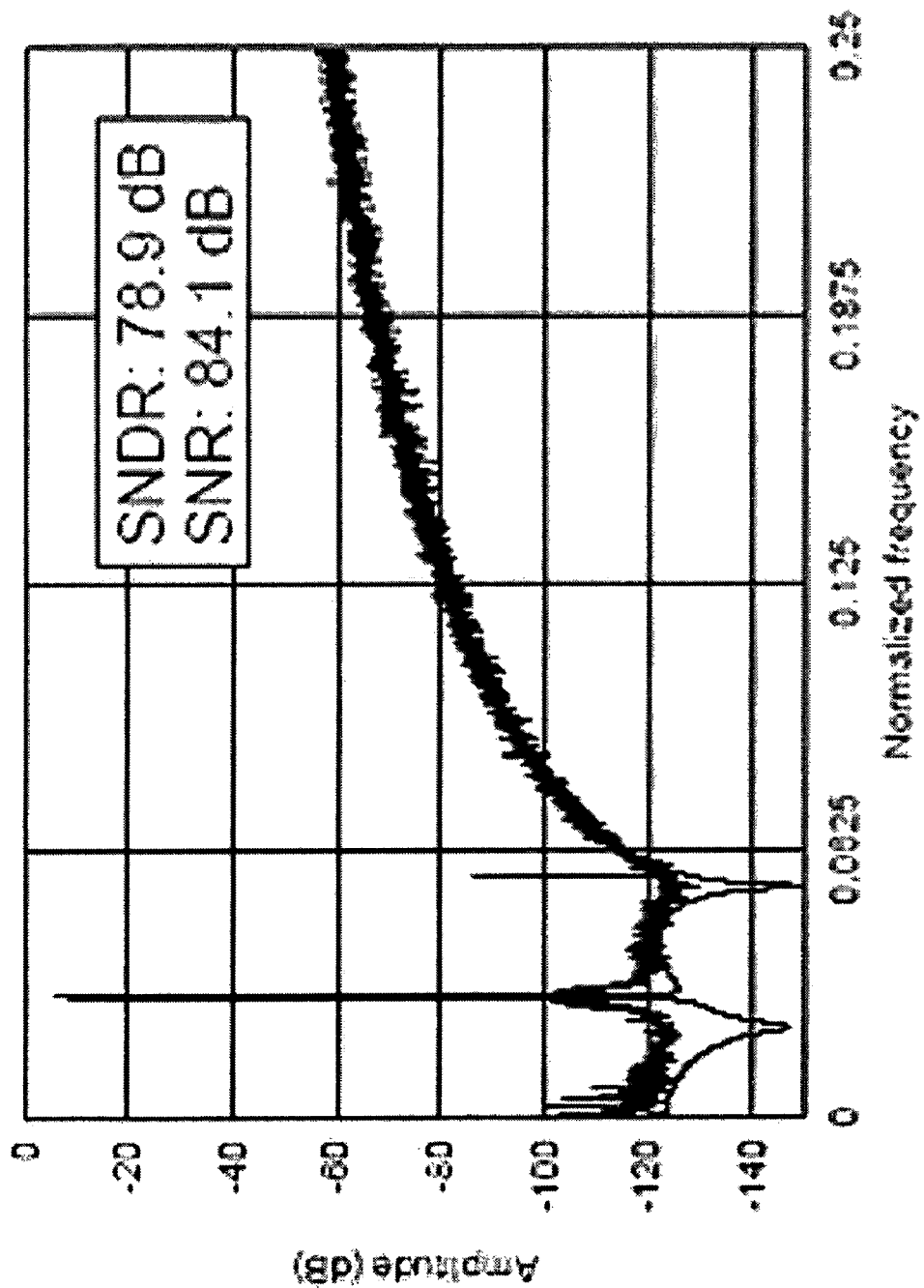
Figure 17D:
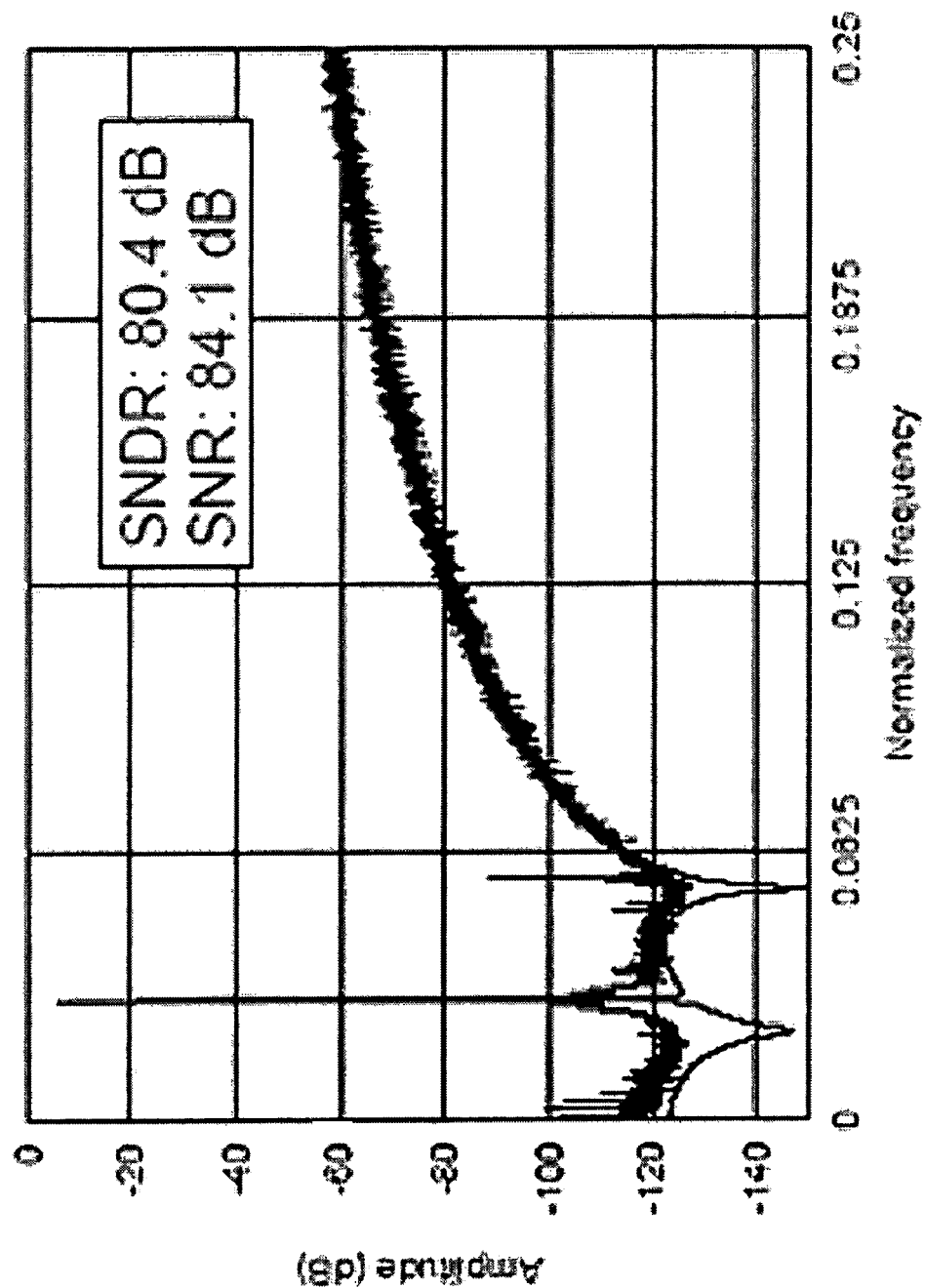

First, the low-frequency spurious tones visible in FIGS. 17B-17D are due to 60-Hz power-source interference that was difficult to attenuate. Second, the signal tone exhibits some skirts due to the jitter of the clock-signal generator in FIGS. 17C-17D. Also, clock jitter spreads the in-band noise and it could be responsible for the higher than expected noise floor of FIGS. 17C-17D compared to the simulated case of FIGS. 15C-15D.

Finally, the mismatch between the on-resistance of the NMOS and PMOS devices of the CMOS HC574 output buffers (FIG. 12E) introduces a systematic error in the RAM table which is not accounted for by the digital correction. This mismatch error generates even-order harmonic distortion and an increased in-band noise floor. Both effects are present in the experimental spectra. When 38-W and 25-W output resistance is used for PMOS and NMOS devices, respectively, simulations can reproduce this effect. However, when an integrated-IC embodiment uses the popular current-steering architecture instead of the voltage-driven architecture of the experimental setup, then this systematic error is expected to disappear.

Despite these experimental-setup problems, the EF DAC using the INL correction combined with DWA provides 84.1 dB of SNR and 80.4 dB of SNDR using an OSR of 8. As simulations demonstrated earlier in section 4.3.2, this 4th-order 5-bit EF DAC potentially can achieve 14 effective bits of resolution for an OSR of 8.

§4.4 CONCLUSIONS

Embodiments consistent with the present invention provide an efficient architecture to achieve high-resolution DACs at low oversampling ratios, which is useful for wide-band applications such as digital subscriber lines. Such embodiments provide a high-order multibit error-feedback DAC with improved stability and with digital correction enhanced by data-weighted averaging. The unit elements of the DAC might be measured by a low-resolution calibration ADC and stored in a RAM table. These values might then be used to compensate for the multibit DAC's distortion by a simple digital addition. The correction advantageously uses simple digital circuitry and a 3-bit calibration ADC enhanced by DWA. Reducing the CADC complexity (e.g., going from 5 bits to 3 bits) not only means reducing the number of comparators in the CADC, but also reducing the matching accuracy of the resistor ladder, leading to an exponential decrease in complexity and chip size.

What is claimed is:

1. For use in a data converter having a delta-sigma loop including an analog digital-to-ahalog-conversion element, a method for correcting etrors of the analog digital-to-analog conversion element, the method comprising:
   a) applying a calibration-based error correction to remove an estimated non-linearity error of the analog digital-to-analog conversion element; and
   b) applying a low-order mismatch-shaping to a signal applied to an input of the analog digital-to-analog conversion element,
   wherein the data converter is a digital-to-analog converter.

2. A data converter having a delta-sigma Loop comprising:
   a) an analog digital-to-analog-conversion element; and
   b) means for correcting errors of the analog digital-to-analog conversion element, the means including
      i) means for applying a calibration-based error correction to remove an estimated non-linearity error of the analog digital-to-analog conversion element; and
      b) means for applying a low-order mismatch-shaping to a signal applied to an input of the analog digital-to-analog conversion element,
   wherein the data converter is a digital-to-analog converter.

3. The data converter of claim 2 wherein the means for applying a calibration-based error correction include a calibration analog-to-digital converter and a RAM.

4. The data converter of claim 2 wherein the means for applying a low-order mismatch shaping include a data-weighted averaging element.

5. The data converter of claim 2 wherein the means for applying a low-order mismatch shaping include a first-ordet dynamic element matching element.

6. The data converter of claim 2 wherein the means fot applying a low-order mismatch shaping include a first-order mismatch shaping element.

7. The data converter of claim 2 wherein the means fo:r applying a low-order mismatch shaping include a unit-element scrambling element.

* * * * *